United States Patent [19]
Morinaka

[11] Patent Number: 5,646,555
[45] Date of Patent: Jul. 8, 1997

[54] PIPELINE STRUCTURE USING POSITIVE EDGE AND NEGATIVE EDGE FLIP-FLOPS TO DECREASE THE SIZE OF A LOGIC BLOCK

[75] Inventor: Hiroyuki Morinaka, Itami, Japan

[73] Assignee: Mitsubishi Denki Kabushiki Kaisha, Tokyo, Japan

[21] Appl. No.: 548,167

[22] Filed: Oct. 25, 1995

[30] Foreign Application Priority Data

Nov. 21, 1994 [JP] Japan .................................. 6-286632

[51] Int. Cl.$^6$ ............................................. H03K 19/0175
[52] U.S. Cl. ............................. 326/93; 326/46; 327/201
[58] Field of Search .............................. 326/93, 96, 40, 326/46; 327/199, 200, 201, 202, 203; 364/736

[56] References Cited

U.S. PATENT DOCUMENTS

| | | | |
|---|---|---|---|
| 4,658,355 | 4/1987 | Hatakeyama et al. | 364/736 |
| 4,820,939 | 4/1989 | Sowell et al. | 327/203 |
| 5,321,368 | 6/1994 | Hoelzle | 326/93 |
| 5,389,838 | 2/1995 | Orengo | 326/93 |
| 5,434,520 | 7/1995 | Yetter et al. | 326/97 |

OTHER PUBLICATIONS

Hwang, Kai; "Advanced Computer Architecture: Parallelism, Scalability, Programmablity"; copyright 1993 by McGraw-Hill, Inc. pp. 270–274.

Computer Architecture A Quantitative Approach, Appendix B39–41, David A. Patterson, et al., ©1990 by Morgan Kaufmann Publishers, Inc.

*Primary Examiner*—David R. Hudspeth
*Assistant Examiner*—Benjamin D. Driscoll
*Attorney, Agent, or Firm*—Oblon, Spivak, McClelland, Maier & Neustadt, P.C.

[57] ABSTRACT

To obtain a semiconductor integrated circuit reduced in hardware size, by avoiding duplication of a common constitution. A logic block (100) comprises logic means (A), logic means (B), and logic means (C), and the output of a pipeline register (11) is connected to the logic means (A) through a signal line (a), and the logic means (A) and logic means (B) are connected through a signal line (b). The logic means (A) is also connected to the logic means (C) through a signal line (c), and the logic means (C) is connected to the input of a pipeline register (21) through a signal line (d). When performing the same logic action in the first half period and second half period of a clock signal, it is not necessary to install two identical logic means, so that the size of the hardware may be reduced as compared with the constitution of installing two identical logic means.

7 Claims, 17 Drawing Sheets

PIPELINE STRUCTURE USING POSITIVE EDGE AND NEGATIVE EDGE FLIP-FLOPS TO DECREASE THE SIZE OF A LOGIC BLOCK

BACKGROUND OF THE INVENTION

1. Field of the Invention

The present invention relates to downsizing of hardware of a semiconductor integrated circuit, and more particularly to downsizing of a logic block of a semiconductor integrated circuit in a pipeline structure.

2. Description of the Background Art

FIG. 20 shows a general pipeline structure for pipeline processing. In FIG. 20, pipeline registers 1 and 2 are connected at the input side and output side of a logic circuit (hereinafter called logic block) 3 for performing logic action. The pipeline registers 1 and 2 are composed of flip-flops, and a clock signal CLK is given to them. Such a method of using the flip-flops as the registers, and controlling the logic action by the timing of providing the flip-flops with the edge of clock signal is called the edge trigger clock system. Herein, in a rear stage of the pipeline register 2, a logic block 4 is connected, which operates differently from the logic block 3, but hereinafter the composition of one logic block and two registers enclosing them is called one unit of pipeline, and one unit is described below.

FIG. 21 shows a block diagram of constitution of the logic block 3. The logic block 3 is a section for terminating a series of logic actions in one period of logic signal. The logic block 3 comprises logic means A, logic means B, and logic means C which perform different logic actions, being arranged in the sequence of A, B, A, C through signal lines b, c, d. In the logic block 3, an input signal given from the pipeline register 1 passes sequentially through the logic means A and logic means B in the first half of the clock signal, and passes sequentially through the logic means A and logic means C in the second half. FIG. 21 shows the passing route of the input signal by arrow. In this way, the logic block 3 has two logic means A identical in logic action, and the input signal passes through the logic means A in both first half and second half of the clock signal, and the same logic action is executed.

In the logic block of the conventional pipeline, as described herein, to repeat the same logic action in the first half and second half of the clock signal, it requires as many compositions as the number of repetitions. Especially for the purpose of numerical calculations such as an adder and multiplier, the same operation is often repeated regularly, and a plurality of operation circuits in the composition of performing the same logic action are required. In such a case, usually, the hardware becomes larger in size because the operation circuit of the same composition is increased in plural positions.

SUMMARY OF THE INVENTION

A first aspect of the invention relates to a semiconductor integrated circuit in a pipeline structure comprising a logic block for performing logic action in one period of a clock signal, an input register for temporarily storing an input signal to the logic block, by operating in response to the clock signal, and an output register for temporarily storing an output signal from the logic block, by operating in response to the clock signal, wherein the logic block is divided into a first half operating section, with its input side connected to the input register, for performing logic action in a first half period of one period of the clock signal by at least one logic means, and a second half operating section, with its output side connected to the output register, for performing logic action in a second half period of one period of the clock signal by at least one logic means, the logic means of the first half operating section and the logic means of the second half operating section include at least one common logic means to be shared, and the logic block comprises memory means for temporarily storing the output of the first half operating section by operating complementarily to the input and output registers, with its input side connected to the output side of the first half operating section, and output side connected to the input side of the second half operating section.

A second aspect of the invention relates to a semiconductor integrated circuit, wherein the logic means of the first half operating section further includes at least one first half logic means not shared with the logic means of the second half operating section.

A third aspect of the invention relates to a semiconductor integrated circuit, wherein the logic means of the second half operating section further includes at least one second half logic means not shared with the logic means of the first half operating section.

A fourth aspect of the invention relates to a semiconductor integrated circuit, wherein the logic means of the first half operating section further includes at least one first half logic means not shared with the logic means of the second half operating section, and the logic means of the second half operating section further includes at least one second half logic means not shared with the logic means of the first half operating section.

A fifth aspect of the invention relates to a semiconductor integrated circuit, wherein the logic means has its input and output connected by a signal route in the sequence of signal transmission, and the logic block further comprises route selecting means for selecting only one route in response to the clock signal if two or more signal routes compete in the input or output of one logic means.

A sixth aspect of the invention relates to a semiconductor integrated circuit, wherein the input and output registers include a register of a first switching type of which output is open and input is closed in the first half period of the clock signal, and reversely open/closed in the second half period, the memory means includes a register of a second switching type of which output is closed and input is open in the first half period of the clock signal, and reversely open/closed in the second half period, and the route selecting means includes gate means of the first switching type to open and close in synchronous with the input and output register, and gate means of the second switching means to open and close complementarily to the gate means of first switching type.

A seventh aspect of the invention relates to a semiconductor integrated circuit, wherein the register of the first switching type is composed of a flip-flop of falling edge type, opened in the output and closed in the input when the clock signal is at a low level, the register of the second switching type is composed of a flip-flop of rising edge type, closed in the output and opened in the input when the clock signal is at a high level, the gate means of the first switching type is composed of a negative latch, opened in the output when the clock signal is at low level, and the gate means of the second switching type is composed of a positive latch, opened in the output when the clock signal is at high level.

According to the semiconductor integrated circuit of the first aspect of the invention, the input signal given to the first half operating section from the input register in the first half period of the clock signal execute logic action, and its result is temporarily stored in the memory means connected to the output side of the first operating half section. The memory means operates complementarily to the input and output registers, and the stored output in the first half operating section is given as the input to the second half operating section in the second half period of the clock signal, so that the logic action is executed in the second half operating section. The first half operating section and second half operating section possess at least one common logic means to be shared mutually among the logic means, and this common logic means repeats the same logic action in the first half period and second half period. It is therefore not necessary to provide the logic block with plural logic means for doing the same logic action in the first half period and second half period of the clock signal.

According to the semiconductor integrated circuit of the second aspect of the invention, if the first half operating section of the logic block includes at least one more first half logic means for performing logic action only in the first half period of the clock, it is not necessary to provide the logic block with plural logic means for doing the same logic action in the first half period and second half period of the clock signal.

According to the semiconductor integrated circuit of the third aspect of the invention, if the second half operating section of the logic block includes at least one more second half logic means for performing logic action only in the second half period of the clock, it is not necessary to provide the logic block with plural logic means for doing the same logic action in the first half period and second half period of the clock signal.

According to the semiconductor integrated circuit of the fourth aspect of the invention, if the first half operating section of the logic block includes at least one more first half logic means for performing logic action only in the first half period of the clock, or if the second half operating section of the logic block includes at least one more second half logic means for performing logic action only in the second half period of the clock, it is not necessary to provide the logic block with plural logic means for doing the same logic action in the first half period and second half period of the clock signal.

According to the semiconductor integrated circuit of the fifth aspect of the invention, the logic means of the logic block further comprises the route selecting means for selecting only one route in response to the clock signal, with its input and output connected by a signal route in the sequence of signal transmission, if two or more signal routes compete in the input or output of the same logic means, and therefore if the sequence of logic actions differs in the first half operating section and second half operating section, the sequence of the logic actions can be freely changed by complicating the signal routes and intersecting the signal routes.

According to the semiconductor integrated circuit of the sixth aspect of the invention, in the first half period of the clock signal, since the outputs of the input and output registers are open, an input signal is given to the first half operating section of the logic block and the logic action is executed. At this time, the input of the memory means is open, and hence the output of the first half operating section is stored. Next, in the second half period of the clock signal, the outputs of the input and output registers are closed, and the output of the memory means opens, and therefore the stored output of the first half operating section is given to the input side of the second half operating section. The gate means of the first switching type of the route selecting means is closed when the outputs of the input and output registers are closed, while the gate means of the second switching means is open, and hence by disposing the gate means of the first switching means in the route not desired to pass signal, and the gate means of the second switching means in the route desired to pass signal, the sequence of logic actions can be freely changed if the sequence of logic actions differs between the first half operating section and second half operating section.

According to the semiconductor integrated circuit of the seventh aspect of the invention, the input and output registers are composed of a flip-flop of falling edge type, the memory means is composed of a flip-flop of rising edge type, the gate means of the first switching type is composed of a negative latch, and the gate means of the second switching means is composed of a positive latch, so that the invention is realized in a relatively simple constitution.

It is therefore an object of the present invention to solve the problems of the prior art and provide a semiconductor integrated circuit reduced in the hardware scale by avoiding duplication of common composition, when repeating same logic action in the first half and second half of clock signal.

These and other objects, features, aspects and advantages of the present invention will become more apparent from the following description of the present invention when taken in conjunction with the accompanying drawings.

DESCRIPTION OF THE PREFERRED EMBODIMENTS

<First Preferred Embodiment>

<Constitution of Logic Block 100>

Figure 1:
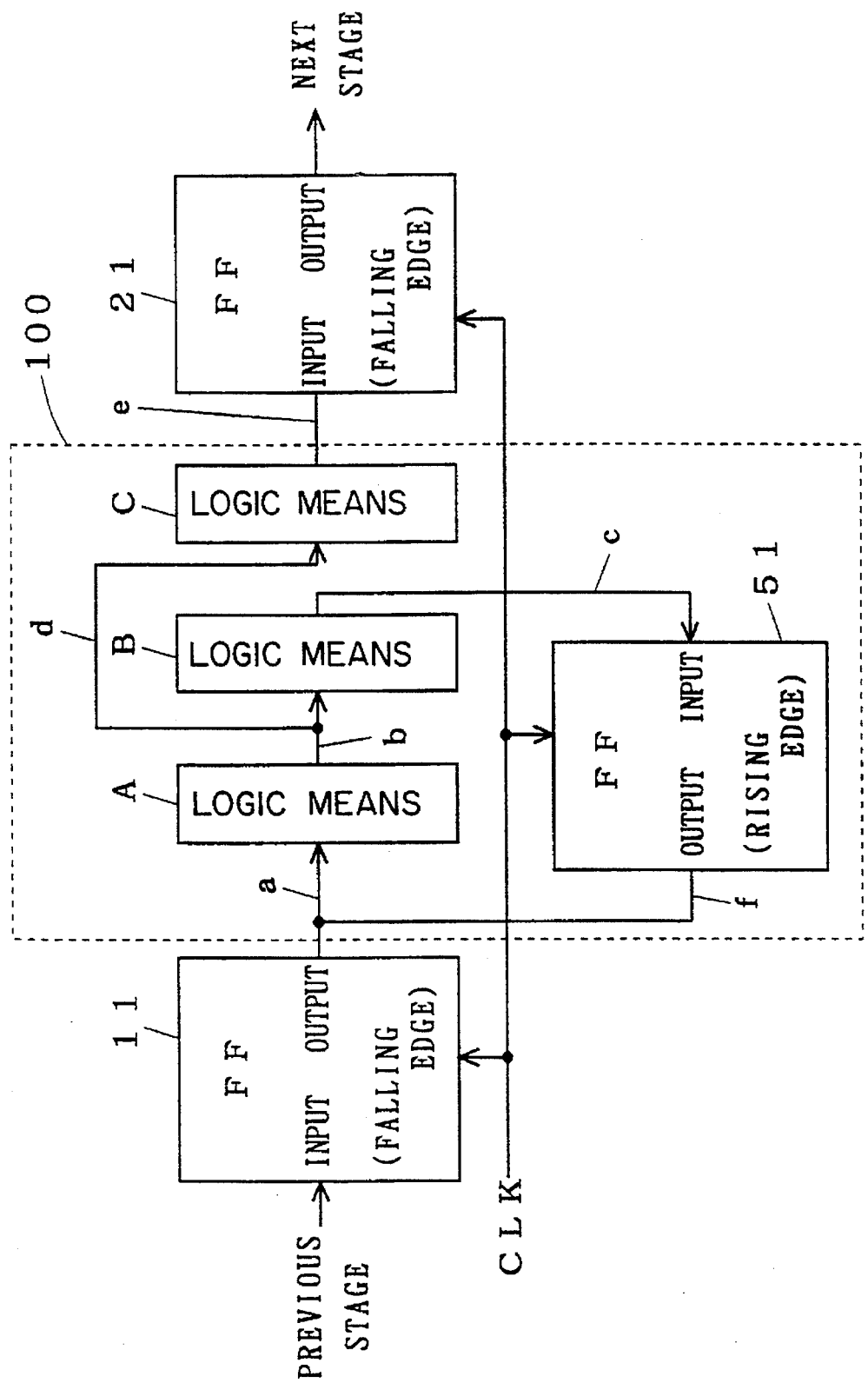
FIG. 1 is a block diagram showing a first preferred embodiment of a semiconductor integrated circuit of the invention.

FIG. 1 is a block diagram showing a constitution of a logic block 100 in a first preferred embodiment of a semiconductor integrated circuit of the invention. In FIG. 1, pipeline registers 11 and 21 are connected to the input side and output side of the logic block 100. The logic block 100 comprises logic means A, logic means B, and logic means C, and the output of the pipeline register 11 is connected to the logic means A through a signal line a, and the logic means A and logic means B are connected through a signal line b. The logic means A is also connected to the logic means C through a signal line d, and the logic means C is connected to the input of the pipeline register 21 through a signal line e.

The logic means B is connected to the input of a register 51 through a signal line c, and the output of the register 51 is connected to the signal line a through a signal line f. A clock signal CLK is designed to be applied to the pipeline registers 11 and 21, and the register 51.

Figure 3:
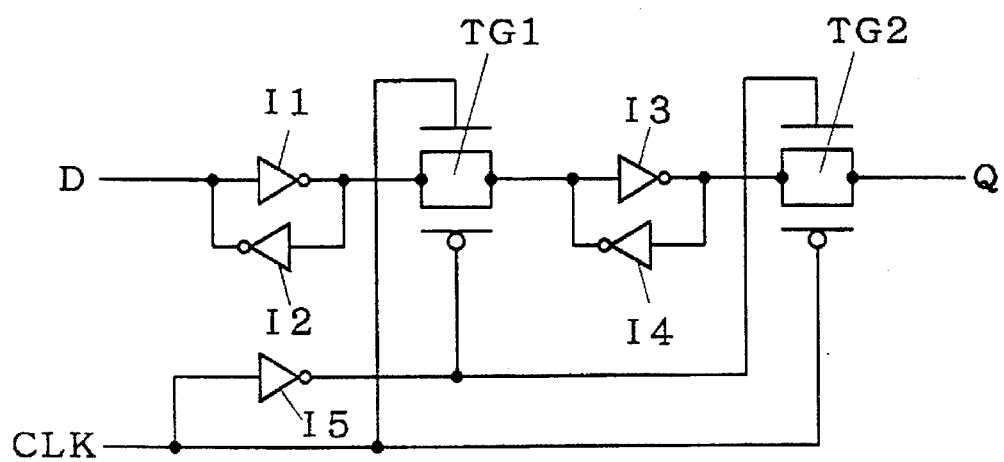
FIG. 3 is a diagram showing a flip-flop of falling edge type.
Figure 4:
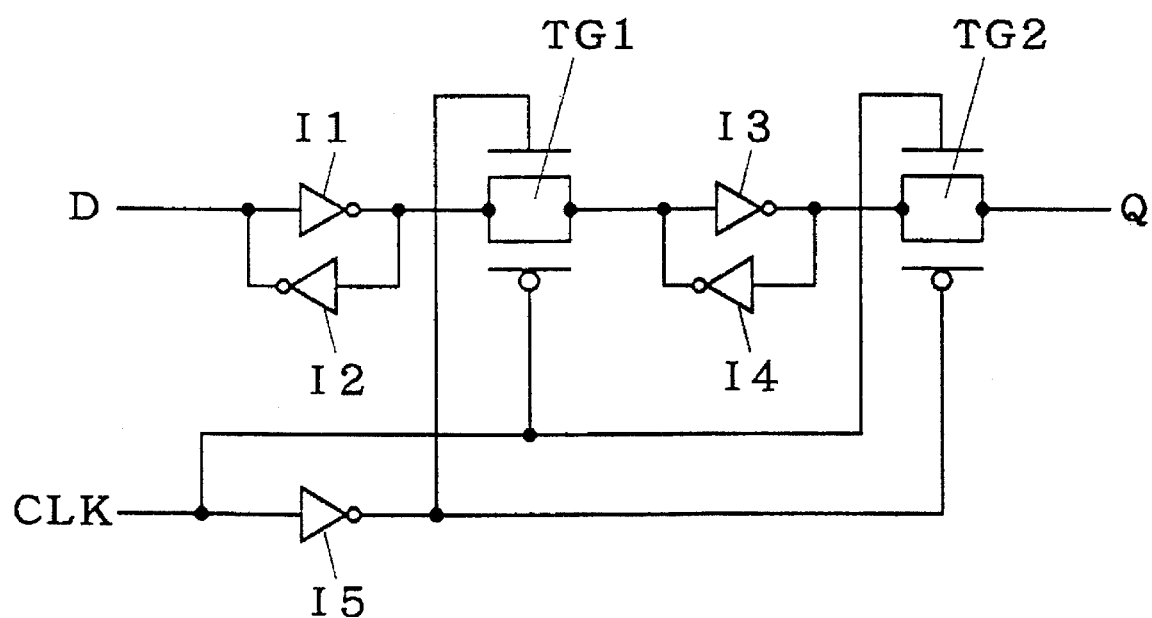
FIG. 4 is a diagram showing a flip-flop of rising edge type.

Herein, the constitution of the pipeline registers 11 and 21 and the register 51 is described while referring to FIG. 3 and FIG. 4. The pipeline registers 11 and 21 are registers using a flip-flop of falling edge type, while the register 51 is a register using a flip-flop of rising edge type.

<Flip-flop of Falling Edge Type>

FIG. 3 shows a circuit diagram of a general flip-flop of falling edge type. In FIG. 3, an input D is given to the input side of an inverter I1, and the output side of the inverter I1 is connected to the input of a transmission gate TG1. Another inverter I2 is connected to the inverter I1 to form a loop. At the output of the transmission gate TG1, the input side of an inverter I3 is connected, and the output side of the inverter I3 is connected to the input of a transmission gate TG2, and the output of the transmission gate TG2 is an output Q. Similarly, another inverter I4 is connected to the inverter I3 to form a loop.

The transmission gates TG1 and TG2 are constituted by combining P channel MOS transistors and N channel MOS transistors, and a clock signal CLK is connected to the gate electrode of the P channel MOS transistor of the transmission gate TG1 and the gate electrode of the N channel MOS transistor of the transmission gate TG2, through an inverter I5. The clock signal CLK is also connected directly to the gate electrode of the N channel MOS transistor of the transmission gate TG1, and the gate electrode of the P channel MOS transistor of the transmission gate TG2.

The operation of the thus constituted flip-flop of falling edge type is explained below while referring to FIG. 3. First, when the clock signal CLK is changed from low to high, the transmission gate TG1 is in a conductive state, and the input D held in the loop circuit composed of the inverters I1 and I2 moves to the inverters I3 and I4. At this time, since the transmission gate TG2 is in a non-conductive state, the input is held in the loop circuit composed of the inverters I3 and I4.

Consequently, when the clock signal changes from high to low, the transmission gate TG1 is in a non-conductive state, and the transmission gate TG2 is in a conductive state, and therefore the input D held in the loop circuit composed of the inverters I3 and I4 is sent out from the transmission gate TG2 as an output Q.

Herein, when the transmission gate TG1 is in a conductive state, it is called "the input is open", when the transmission gate TG2 is in a conductive state, it is called "opened in the output", when the transmission gate TG1 is in a non-conductive state, it is called "the input is closed", and when the transmission gate TG2 is in a non-conductive state, it is called "closed in the output". In short, therefore, the operation of the flip-flop of falling edge type may be explained as follows: the output is open for a half period when the clock signal is low, and the input is open for a half period when the clock signal is high.

<Flip-flop of Rising Edge Type>

Next, FIG. 4 shows a circuit diagram of a general flip-flop of rising edge type. In FIG. 4, an input D is given to the input side of an inverter I1, and the output side of the inverter I1 is connected to the input of a transmission gate TG1. Another inverter I2 is connected to the inverter I1 to form a loop. At the output of the transmission gate TG1, the input side of an inverter I3 is connected, and the output side of the inverter I3 is connected to the input of a transmission gate TG2, and the output of the transmission gate TG2 is an output Q. Similarly, another inverter I4 is connected to the inverter I3 to form a loop.

The transmission gates TG1 and TG2 are constituted by combining P channel MOS transistors and N channel MOS transistors, and a clock signal CLK is connected to the gate electrode of the P channel MOS transistor of the transmission gate TG1 and the gate electrode of the N channel MOS transistor of the transmission gate TG2, through an inverter I5. The clock signal CLK is also connected directly to the gate electrode of the N channel MOS transistor of the transmission gate TG1, and the gate electrode of the P channel MOS transistor of the transmission gate TG2.

The operation of the thus constituted flip-flop of falling edge type is explained below while referring to FIG. 4. First, when the clock signal CLK is changed from high to low, the transmission gate TG1 is in a conductive state, and the input D held in the loop circuit composed of the inverters I1 and I2 moves to the inverters I3 and I4. At this time, since the transmission gate TG2 is in a non-conductive state, the input is held in the loop circuit composed of the inverters I3 and I4.

Consequently, when the clock signal changes from low to high, the transmission gate TG1 is in a non-conductive state, and the transmission gate TG2 is in a conductive state, and therefore the input D held in the loop circuit composed of the inverters I3 and I4 is sent out from the transmission gate TG2 as an output Q.

In short, therefore, the operation of the flip-flop of falling edge type may be explained as follows: the output is open for a half period when the clock signal is high, and the input is open for a half period when the clock signal is low.

<Operation of Logic Block 100>

Referring back to FIG. 1, the operation of the logic block 100 is described below. First, when the clock signal CLK is changed from high to low, the output of the pipeline register 11, that is, the output of the flip-flop of falling edge type opens, and an input signal IS from the logic block in the front stage held in the pipeline register 11 is given to the signal line a.

The input signal IS passes through the logic means A, and is given to the signal line b as signal S1, and also passes through the logic means B to be given to the signal line c as signal S2. At this time, the signal S1 is also given to the logic means C through the signal line d, and passes through the logic means C to be given to the pipeline register 21 as signal S11, but since the input of the pipeline register 21, that is, the input of the flip-flop of falling edge type is closed, the signal S11 is not held.

On the other hand, the signal S2 is given to the register 51 through the signal line c. At this time, the input of the register 51, that is, the input of the flip-flop of rising edge type is open, and the signal S2 is held in the register 51. However, since the output of the register 51 is closed, the signal S2 is not given to the signal line a.

When the clock signal CLK changes from low to high, the output of the pipeline register 11 is closed, and the output of the register 51 opens. Therefore, the signal S2 held in the register 51 is given to the signal line a, and the signal S2 passes through the logic means A, and is given to the signal line b as signal S3, and is successively given to the logic means C through the signal line d, and further passes through the logic means C and is given to the signal line e as signal S4. At this time, since the input of the pipeline register 21 is open, the signal S4 is held in the pipeline register 21. On the other hand, the signal S4 passes through the logic means B and is given also to the register 51 through the signal line c as signal S41, but since the input of the register 51 is closed, the signal S41 is not held.

In consequence, when the clock signal CLk is changed again from high to low, the signal S4 held in the pipeline register 21 is given to the logic block of the next stage, and a new input signal from the logic block of the previous stage is given to the signal line a.

Figure 2:
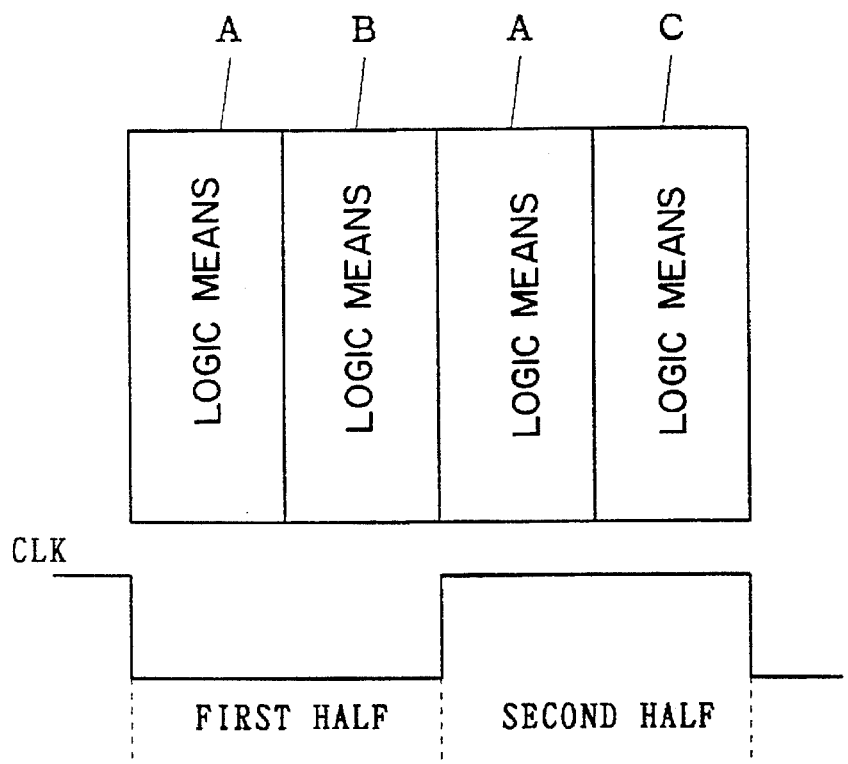
FIG. 2 is a diagram showing the action of the first preferred embodiment of the semiconductor integrated circuit of the invention.

This operation is schematically shown in FIG. 2. In FIG. 2, corresponding to the clock signal CLK, blocks coded with A, B, A, C are arranged sequentially. It means that the logic actions A, B are executed in the first half period when the clock signal is low, while the logic actions A, C are executed in the second half period when the clock signal is high.

In the logic block 100 operating in such a manner, the signal S4 is a signal passing through the logic means A, B, A, C sequentially, and is a signal undergoing logic actions A+B+A+C. It means that, by using one logic means A twice, the logic actions A+B+A+C can be executed without installing two logic means A in the logic block.

Usually the circuit of the logic means A is larger than the circuit of the newly installed register 51, and therefore by omitting one logic means A, the hardware of the logic block is reduced.

<Second Preferred Embodiment>

Figure 5:
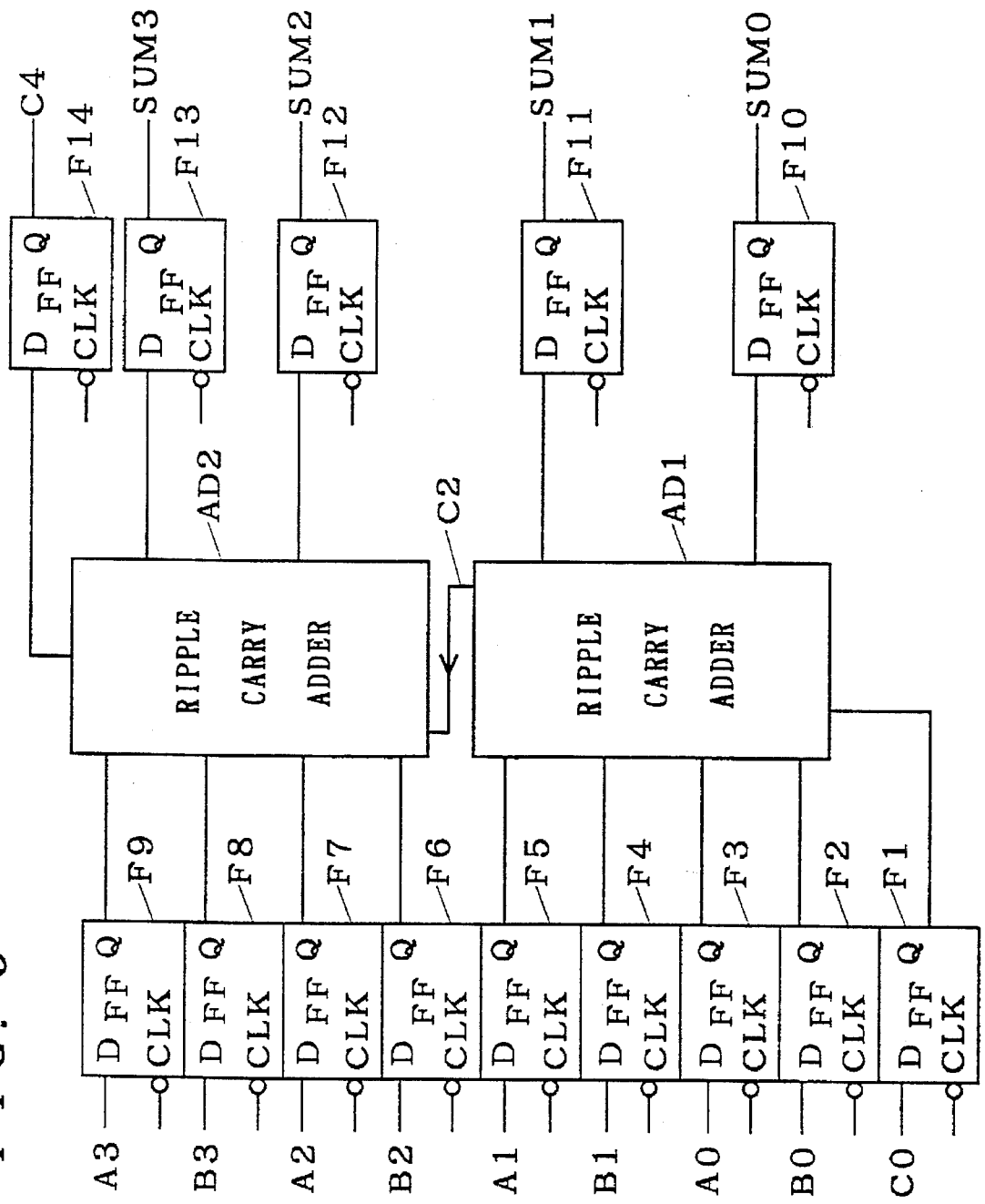
FIG. 5 is a diagram showing a constitution of a general four-bit adder.

As a second preferred embodiment of a semiconductor integrated circuit of the invention, an application of the invention in an adder for performing a four-bit addition in one period of the clock signal is described below. FIG. 5 shows a constitution of a general four-bit adder.

In FIG. 5, to perform four-bit addition, two-bit ripple carry adders AD1 and AD2 are provided. At the input side of the ripple carry adder AD1, the outputs Q of flip-flops F1 to F5 of falling edge type are connected, and at the input side of the ripple carry adder AD2, the outputs Q of flip-flops F6 to F9 of falling edge type are connected. At the input D of the flip-flop F1, a carry C0 is entered from the adder of the previous stage not shown, and at the inputs D of the flip-flops F2 to F9, input data B0, A0, B1, A1, B2, A2, B3, A3 are entered respectively.

At the output side of the ripple carry adder AD1, the inputs D of flip-flops F10 and F11 of falling edge type are connected, and from the outputs Q of the flip-flops F10 and F11, addition results SUM0 and SUM1 are produced. Besides, the carry C2 produced from the ripple carry adder AD1 by addition operation is given to the ripple carrier adder AD2.

At the output side of the ripple carry adder AD2, the inputs D of flip-flops F12 and F13 of falling edge type are connected, and from the outputs Q of the flip-flops F12 and F13, addition results SUM2 and SUM3 are produced. The carry C4 produced from the ripple carry adder AD2 by addition operation is produced from the output Q of a flip-flop F14.

<Constitution of Ripple Carry Adder>

Figure 6:
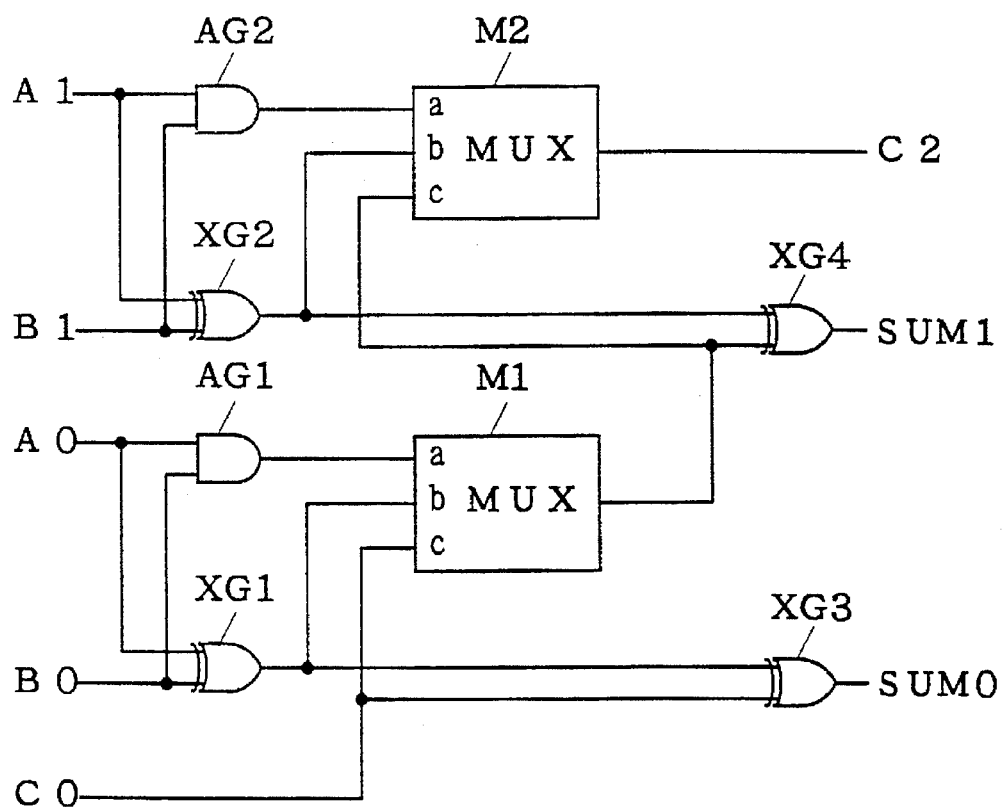
FIG. 6 is a diagram showing a constitution of a general two-bit ripple carry adder.

The constitution of the ripple carry adder AD1 is shown in FIG. 6. In FIG. 6, input data B0 is given to the inputs of AND gate AG1 and XOR (ExNOR) gate XG1, and similarly input data A0 is given to the inputs of the AND gate AG1 and XOR gate XG1. The output of the AND gate AG1 is given to a-input of a multiplexer M1, and the output of the XOR gate XG1 is given to b-input of the multiplexer X1 and input of an XOR gate XG3. A carry C0 is given to c-input of the multiplexer M1 and input of the XOR gate XG3. The multiplexer M1 receives the outputs of the AND gate AG1 and XOR gate XG1, and the carry C0, and outputs a carry C1.

Input data B1 is given to the inputs of AND gate AG2 and XOR gate XG2, and similarly input data A1 is given to the inputs of the AND gate AG2 and XOR gate XG2. The output of the AND gate AG2 is given to a-input of a multiplexer M2, and the output of the XOR gate XG2 is given to b-input of the multiplexer M2 and input of an XOR gate XG4. The carry C1 is given to c-input of the multiplexer M2 and the input of the XOR gate XG4. The multiplexer M2 receives the outputs of the AND gate AG2 and XOR gate XG2, and the carry C1, and outputs a carry C2.

Herein, the outputs of the XOR gates XG3 and XG4 are produced as addition results SUM0 and SUM1, and the carry C2 is given to the ripple carry adder AD2. The constitution of the ripple carry adder AD2 is identical, and the constitution of the ripple carry adder AD2 is realized by replacing the input data B0, A0, B1, A1 by B2, A2, B3, A3, the addition results SUM0 and SUM1 by SUM2 and SUM3, and the carries C0, C1, C2 by C2, C3, C4, and hence detailed description is omitted.

<Constitution of Multiplexer>

Figure 7:
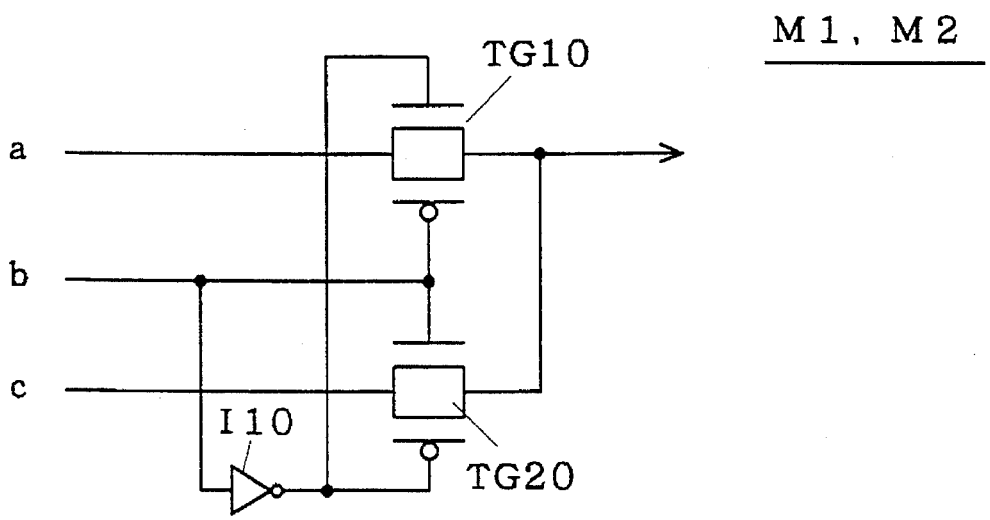
FIG. 7 is a diagram showing a constitution of a general multiplexer.

FIG. 7 shows the constitution of multiplexers M1 and M2. The multiplexers M1 and M2 are identical in constitution, possessing transmission gates TG10 and TG20 and inverter I10 composed by combining P channel MOS transistors and N channel MOS transistors.

In FIG. 7, a-input is given to the input of the transmission gate TG10, and c-input is given to the input of the transmission gate TG20. Moreover, b-input is given to the gate electrode of the P channel MOS transistor of the transmission gate TG10 and the gate electrode of the N channel MOS transistor of the transmission gate TG20, and further through the inverter I10 it is applied to the gate electrode N channel MOS transistor of transmission gate TG10 and the gate electrode of the P channel MOS transistor of the transmission gate TG20. Either transmission gate TG10 or TG20 is set in a conductive state depending on the signal given to the b-input. Its output is a carry.

Figure 8:
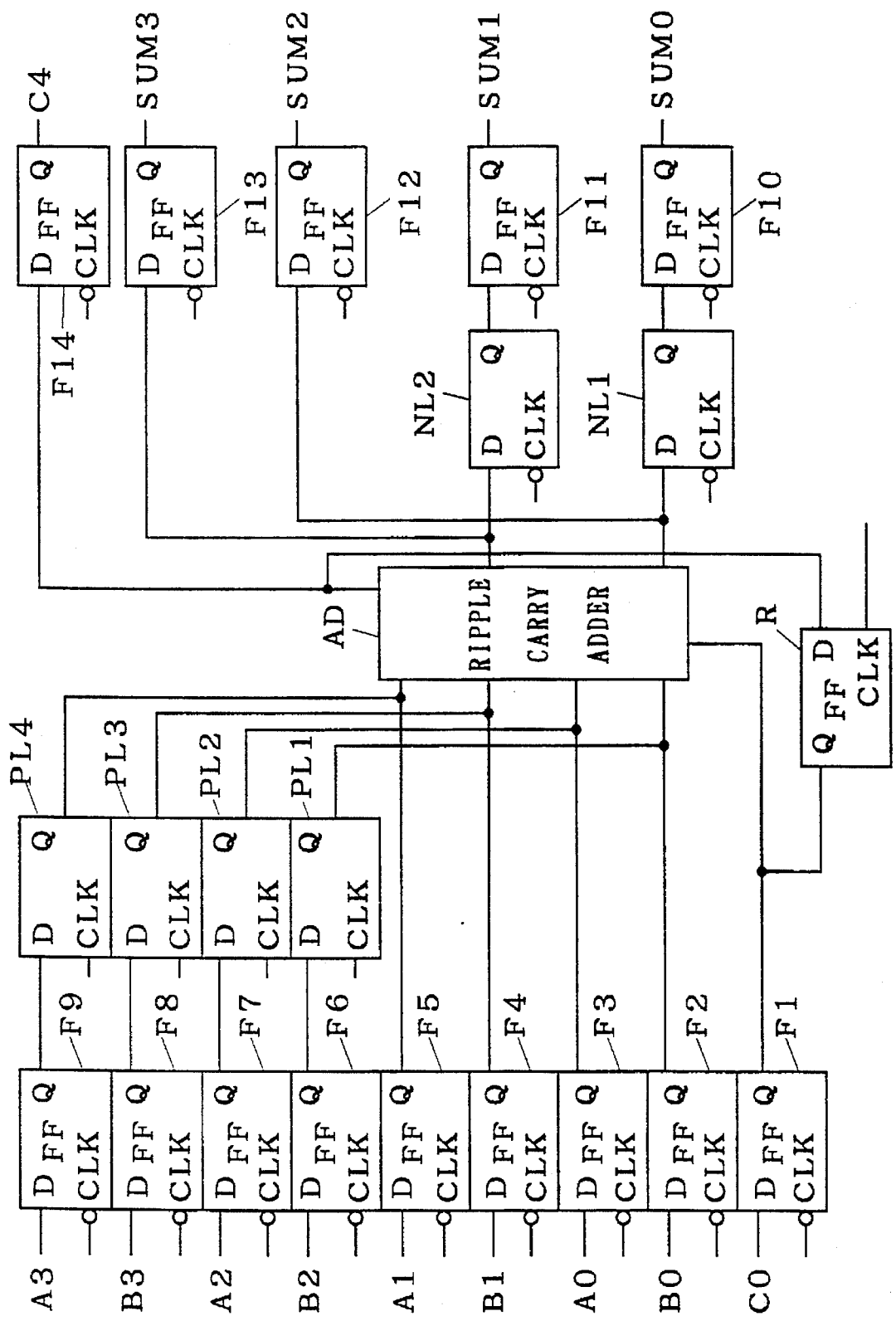
FIG. 8 is a diagram showing a constitution of a four-bit adder applying the invention, as a second preferred embodiment of a semiconductor integrated circuit of the invention.

As described herein, a general four-bit adder is composed of two two-bit ripple carry adders 2 identical in constitution. Referring now to FIG. 8, the constitution of the four-bit adder by applying the semiconductor integrated circuit of the invention is described below.

In FIG. 8, to perform four-bit addition, a two-bit ripple carry adder AD is provided. Herein, the constitution of the ripple carry adder AD is the same as the constitution of the ripple carry adder AD1 explained by reference to FIG. 6, and duplicated description is omitted.

At the input side of the ripple carry adder AD, outputs Q of flip-flops F1 to F5 of falling edge type are given directly. Besides, outputs Q of flip-flops F6 to F9 of falling edge type are given to inputs D of P latches (positive latches) PL1 to PL4, and also given to the ripple carry adder AD as outputs Q of P latches PL1 to PL4.

To the input D of the flip-flop F1, a carry is entered from an adder in the previous stage (not shown), and input data B0, A0, B1, A1, B2, A2, B3, A3 are entered in inputs D of flip-flops F2 to F9.

At the output side of the ripple carry adder AD, inputs D of N latches (negative latches) NL1 and NL2 are connected, and outputs Q of the N latches NL1 and NL2 are applied to flip-flops F10 and F11 of falling edge type. At the output side of the ripple carry adder AD, inputs D of flip-flops F12 and F13 of falling edge type are connected directly.

A carry outputted from the ripple carry adder AD passes either a route of being outputted through a flip-flop F14 of falling edge type, or a route of entering again the ripple carry adder AD through a flip-flop R of rising edge type.

From outputs Q of the flip-flops F10 and F11, addition results SUM0 and SUM1 are outputted, and from outputs Q of flip-flops F12 and F13, addition results SUM2 and SUM3 are outputted.

<Constitution of Negative Latch and Positive Latch>

Figure 9:
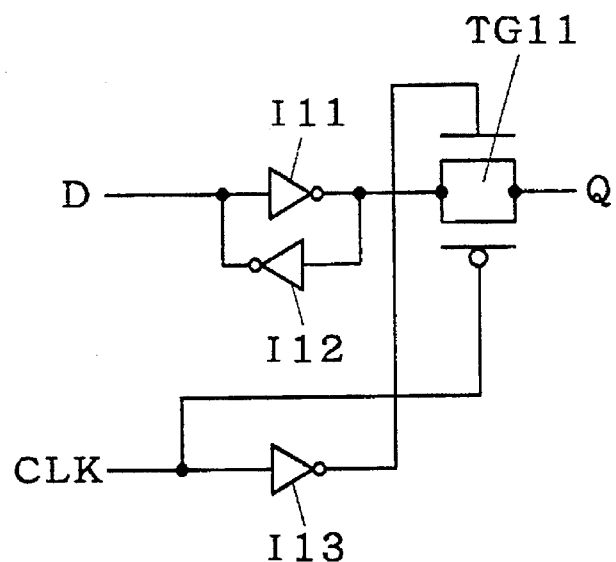
FIG. 9 is a diagram showing a negative latch.
Figure 10:
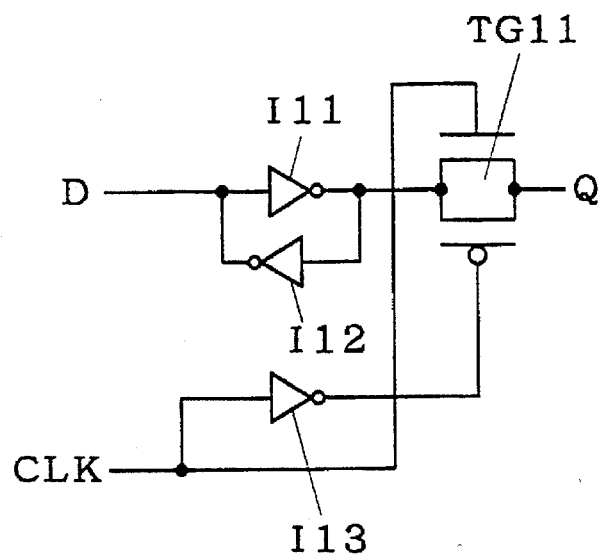
FIG. 10 is a diagram showing a positive latch.

Referring now to FIG. 9 and FIG. 10, the constitution of a negative latch (N latch) and a positive latch (P latch) is described below.

FIG. 9 shows a circuit diagram of a general negative latch. In FIG. 9, an input D is given to the input side of the inverter I11, and the output side of the inverter I11 is connected to the input of the transmission gate TG11. To the inverter I11, an inverter I12 is connected to form a loop, and the output of the transmission gate TG1 is output Q.

The transmission gate TG11 is composed by combining a P channel MOS transistor and an N channel MOS transistor, and a clock signal CLK is given to the gate electrode of the N channel MOS transistor of the transmission gate TG11 through an inverter I13. The clock signal CLK is also given directly to the gate electrode of the P channel MOS transistor of the transmission gate TG11.

The operation of the thus composed N latch is described below while referring to FIG. 9. First, when the clock signal CLK is changed from high to low, the transmission gate TG11 is in a conductive state, and the signal held in the loop circuit composed of the inverters I11 and I12 is outputted from the output Q.

Consequently, when the clock signal changes from low to high, the transmission gate TG11 is in a non-conductive state, and signal is not outputted. Herein, when the transmission gate TG11 is in a conductive state, it is called "opened in the output", and when the transmission gate TG11 is in a non-conductive state, it is called "closed in the output".

In short, therefore, the operation of the N latch is as follows: the output is open while the clock signal CLK is low, and the output is closed while the clock signal is high. Incidentally, the "input" to the output is always open.

FIG. 10 shows a circuit diagram of a general P latch. In FIG. 10, an input D is given to the input side of the inverter I11, and the output side of the inverter I11 is connected to input of the transmission gate TG11. To the inverter I11, an inverter I12 is connected to form a loop, and the output of the transmission gate TG1 is output Q.

The transmission gate TG11 is composed by combining a P channel MOS transistor and an N channel MOS transistor, and a clock signal CLK is given to the gate electrode of the N channel MOS transistor of the transmission gate TG11 through an inverter I13. The clock signal CLK is also given directly to the gate electrode of the P channel MOS transistor of the transmission gate TG11.

The operation of the thus composed N latch is described below while referring to FIG. 10. First, when the clock signal CLK is changed from low to high, the transmission gate TG11 is in a conductive state, and the signal held in the loop circuit composed of the inverters I11 and I12 is outputted from the output Q.

Consequently, when the clock signal changes from high to low, the transmission gate TG11 is in a non-conductive state, and signal is not outputted.

In short, therefore, the operation of the P latch is as follows: the output is open while the clock signal CLK is high, and the output is closed while the clock signal is low. Incidentally, the "input" to the output is always open.

Figure 11:
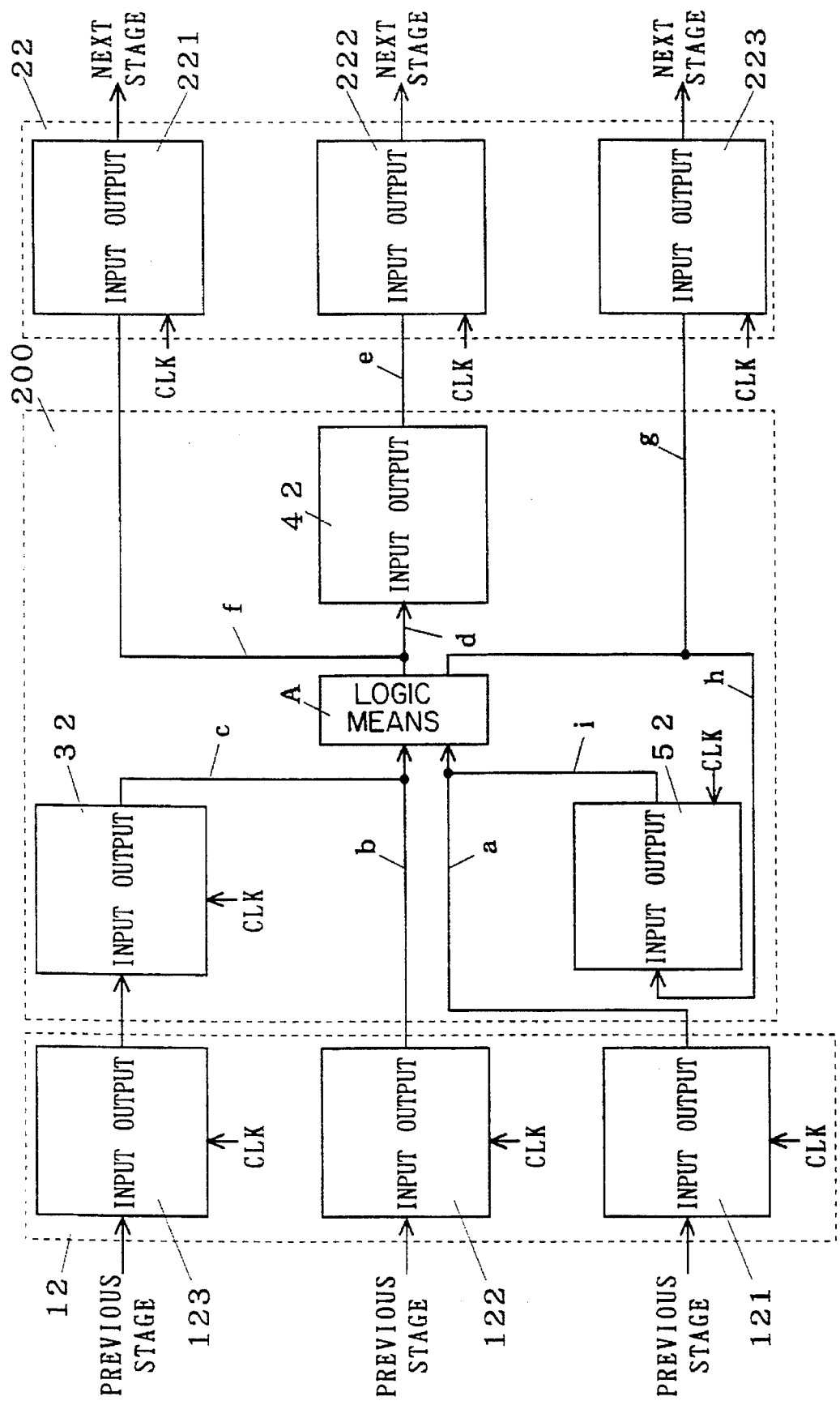
FIG. 11 is a block diagram showing a constitution of the second preferred embodiment of the semiconductor integrated circuit of the invention.

A block diagram for explaining the operation of the four-bit adder shown in FIG. 8 is shown in FIG. 11. In FIG. 11, the central portion indicated by the broken line denotes a logic block 200 having logic means A. At the input side and output side of the logic block 200, pipeline registers 12 and 22 are indicated by broken line.

The pipeline register 12 is a register composed of flip-flops F1 to F9 of falling edge type shown in FIG. 8, and is divided into three sections by function. To a pipeline register 121, a carry is given from a logic block in a previous stage (not shown). It corresponds to the flip-flop F1 shown in FIG. 8. To a pipeline register 122, input data B0, A0, B1, A1 are given from a logic block in a previous stage (not shown). It corresponds to the flip-flops F2 to F5 shown in FIG. 8. To a pipeline register 123, input data B2, A2, B3, A3 are given from a logic block in a previous stage (not shown). It corresponds to the flip-flops F6 to F9 shown in FIG. 8.

The pipeline register 22 is a register composed of flip-flops F10 to F14 of falling edge type shown in FIG. 8, and it is divided into three sections by function. A pipeline register 221 outputs addition results SUM0 and SUM1 to a logic block in a succeeding stage (not shown). It corresponds to flip-flops F10 and F11 shown in FIG. 8. A pipeline register 222 outputs addition results SUM2 and SUM3 to a logic block in a succeeding stage (not shown). It corresponds to flip-flops F12 and F13 shown in FIG. 8. A pipeline register 223 outputs a carry to a logic block in a succeeding stage (not shown). It corresponds to flip-flop F14 shown in FIG. 8.

The constitution of the logic block 200 is described below. The pipeline registers 121 and 122 are connected to the logic means A through signal lines a and b. The logic means A corresponds to the ripple carry adder AD shown in FIG. 8.

The output of the pipeline register 123 is connected to a P latch 32, and the P latch 32 is connected to the signal line b through the signal line c. The P latch 32 corresponds to P latches PL1 to PL4 in FIG. 8.

The output of the logic means A is connected to an N latch 42 through the signal line d, and the N latch 42 is connected to the pipeline register 222 through signal line e. The output of the logic means A is also connected to the pipeline register 221 through signal line f connected to the signal line d. The output of the logical means A is further connected to the pipeline register 223 through signal line g, and is also connected to a register 52 through signal line h connected to the signal line g. The register 52 corresponds to the flip-flop R of rising edge type shown in FIG. 8, and the register 52 is connected to the signal line a through signal line i.

<Operation of Logic Block 200>

The operation of the logic block 200 is described below with reference to FIG. 11. First, when the clock signal CLK is changed from high to low, the outputs of the pipeline registers 121 to 123, that is, the outputs of the flip-flops F1 to F9 of falling edge type will open. The input signals IS1 and IS2 from the logic block of the previous stage held in the pipeline registers 121 and 122, that is, carry 0 and input data B0, A0, B1, A1 are given to the logic means A through signal lines a and b.

At this time, the input signal IS3 from the logic block of the previous stage held in the pipeline register 123, that is, input data B2, A2, B3, A3 are given to the P latch 32, but the output of the P latch 32 is closed, and the input signal IS3 is not given to the logic means A. In the logic means A, that is, in the ripple carry adder AD, addition of lower two bits is executed according to the input signals IS1 and IS2, and signal S10 and signal S20, that is, addition results SUM0, SUM1 are respectively outputted to signal lines g and d.

The signal S20 is given to the N latch 42 through signal line d. The output of the N latch 42 is open, and the signal S20 is given to the pipeline register 222 through signal line e, but since the pipeline register 222 is a flip-flop of falling edge type, the input is closed, and the signal S20 is not held. Besides, the signal S20 is also given to the pipeline register 221 from signal line d through signal line f, but since the pipeline register 221 is a flip-flop of falling edge type, its input is closed, and the signal S20 is not held.

On the other hand, the signal S10 is given to the register 52 from signal line g through signal line h. The register 52 is a flip-flop of rising edge type, and hence its input is open, and the signal S10 is held. The signal S10 is also given to the pipeline register 223 through signal line g, but since it is a flip-flop of falling edge type, its input is closed, and the signal S10 is not held.

Next, when the clock signal CLK is changed from low to high, the outputs of the pipeline registers 121 to 123 are closed, and the input signals IS1 to IS3 from the logic block of previous stage are interrupted. At this time, the output of the P latch 32 opens, and the held input signal IS3 is outputted. The input signal IS3 is given to the logic means A from signal line c through signal line b. The output of the register 52 also opens, and the held signal S10 is also given to the logic means A. At this time, the output of the N latch 42 closes, and the input of the pipeline register 222 opens, so that the signal S10 is held in the pipeline register 222.

In the logic means A, addition of upper two bits is executed according to the input signals IS10 and IS3, and signal S100 and signal S30, that is, carry C4 and addition results SUM2, SUM3 are respectively outputted to the signal lines g and d.

The signal S100 is given to the pipeline register 223 through the signal line g, and is held in the pipeline register 223. On the other hand, it is also given to the register 52, but since its input is closed, the signal S100 is not held.

The signal S30 is given to the pipeline register 221 from signal line d through signal line f, and is held in the pipeline register 221. On the other hand, it is also given to the N latch 42, but since its output is closed, the signal S30 is not given to the pipeline register 222.

Therefore, before the clock signal CLK changes next from high to low, the signal S100, signal S20, and signal S30 are held in the pipeline registers 221 to 223, that is, in the pipeline register 22. Hence, when the clock signal CLK changes next from high to low, the output of the pipeline register 22 opens, and the signal S100, signal S20, and signal S30 are given to the logic block of the succeeding stage, and the output of the pipeline register 12 opens, and a new input signal is given from the logic block of the previous stage.

By composing the four-bit adder by using the logic block 200 operating in this manner, it is not necessary to use two two-bit carry adders, and hence the hardware of the logic block is reduced in size. Comparing this effect by the number of transistors, 224 transistors are needed in the four-bit adder not applying the invention, while only 166 are needed in the four-bit adder using the logic block 200, so that the number of transistors can be saved by 26%.

<Third Preferred Embodiment>

<Constitution of Logic Block 300>

Figure 12:
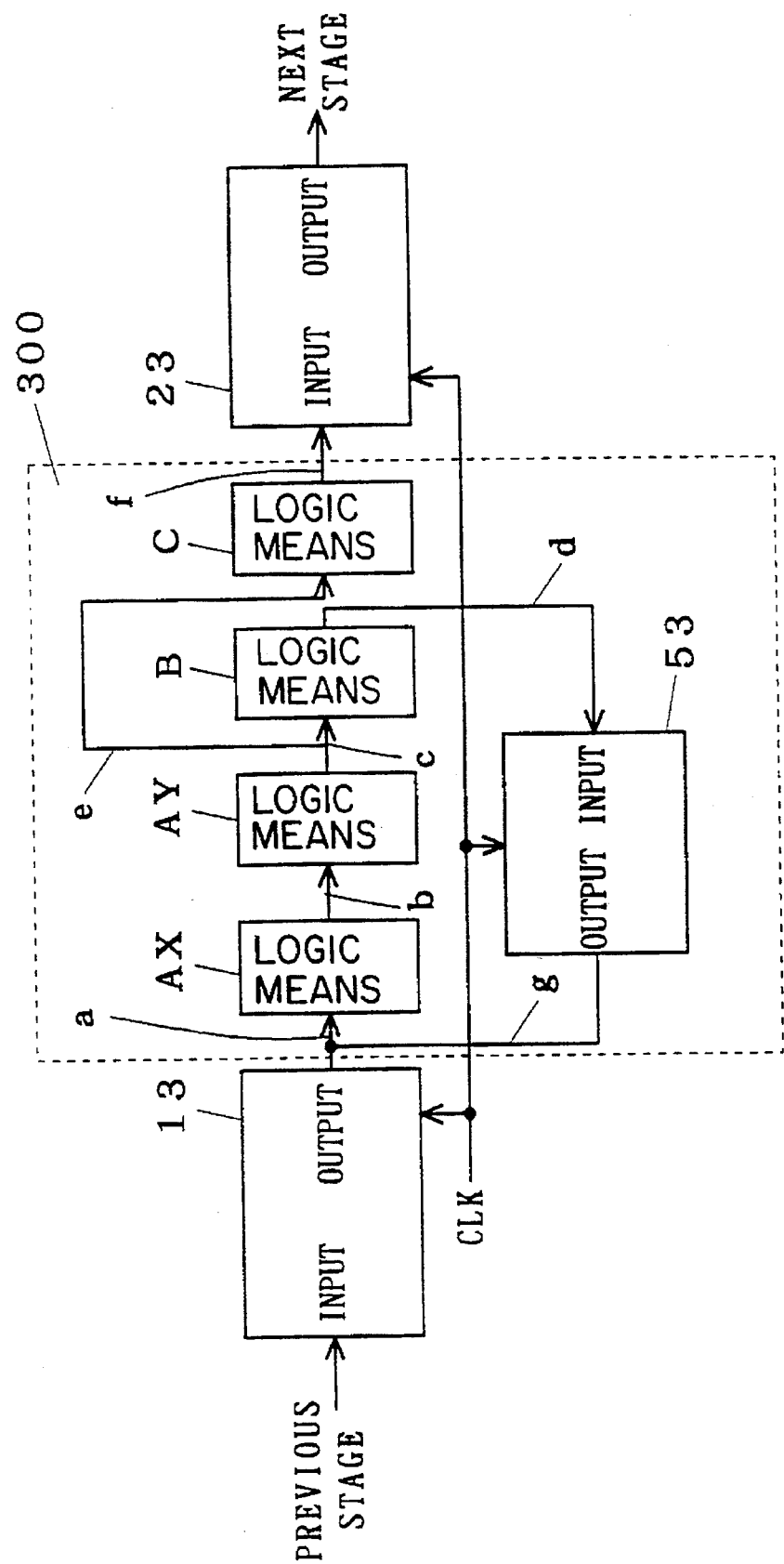
FIG. 12 is a block diagram showing a constitution of a third preferred embodiment of a semiconductor integrated circuit of the invention.

FIG. 12 shows the constitution of a logic block 300 as a third preferred embodiment of a semiconductor integrated circuit of the invention. In FIG. 12, at the input side and output side of the logic block 300, pipeline registers 13 and 23 are connected. The logic block 300 comprises logic means AX, logic means AY, logic means B, and logic means C, and the output of the pipeline register 13 is connected to the logic means AX through signal line a, and the logic means AX and logic means AY are connected through signal line b. The logic means AY is connected to the logic means B through signal line c, and the logic means B is connected to the input of a register 53 through signal line d.

The logic means AY is also connected to the logic means C through signal line e, and the logic means C is connected to the input of the pipeline register 23 through signal line f. Herein, the output of the register 53 is connected to the signal line a through signal line g. A clock signal CLK is given to the pipeline registers 13 and 23.

The pipeline registers 13 and 23 are registers of flip-flops of falling edge type, while the register 53 is a register of a flip-flop of rising edge type.

<Operation of Logic Block 300>

The operation of the logic block 300 is described by referring to FIG. 12. First, when the clock signal CLK changes from high to low, the output of the pipeline register 13, that is, the output of the flip-flop of falling edge type opens, and the input signal IS from the logic block of previous stage held in the pipeline register 13 is given to the signal line a.

The input signal is given to the signal line b through the logic means AX as signal S1, and successively passes through the logic means AY to be given to the logic means B through signal line c as signal S2, and also passes through the logic means B to be given to the register 53 through signal line d as signal S3. At this time, the input of the register 53, that is, the input of the flip-flop of rising edge type is open, and the signal S3 is held in the register 53. However, since the output of the register 53 is closed, the signal S3 is not given to the signal line a.

On the other hand, the signal S2 is also given to the logic means C through signal line e, and passes through the logic means C to be given to the pipeline register 23 through signal line f as signal S21, but since the input of the pipeline register 23, that is, the input of the flip-flop of falling edge type is closed, the signal S21 is not held in the pipeline register 23.

Next, when the clock signal CLK changes from low to high, the output of the pipeline register 13 is closed, and the output of the register 53 opens. Therefore, the signal S3 held in the register 53 is given to the signal line a, and the signal S3 passes through the logic means AX to be given to the signal line b as signal S4, and is successively given to the logic means AY, and passes through the logic means AY to be given to the signal line c as signal S5.

The signal S5 is given to the logic means C through the signal line e, and passes through the logic means C to be given to the pipeline register 23 as signal S6. At this time, the input of the pipeline register 23 is open, and thereby the signal S6 is held in the pipeline register 23.

On the other hand, the signal S5 is also given to the register 53 through signal line d as signal S51 by passing through the logic means B, but since the input of the register 53 is closed, the signal S51 is not held.

When the clock signal CLK changes again from high to low, the signal S6 held in the pipeline register 23, that is, the signal undergoing the logic actions AX+AY+B+AX+AY+C is given to the logic block of the next stage, and a new input signal from the logic block of previous stage is given to the signal line a.

Figure 13:
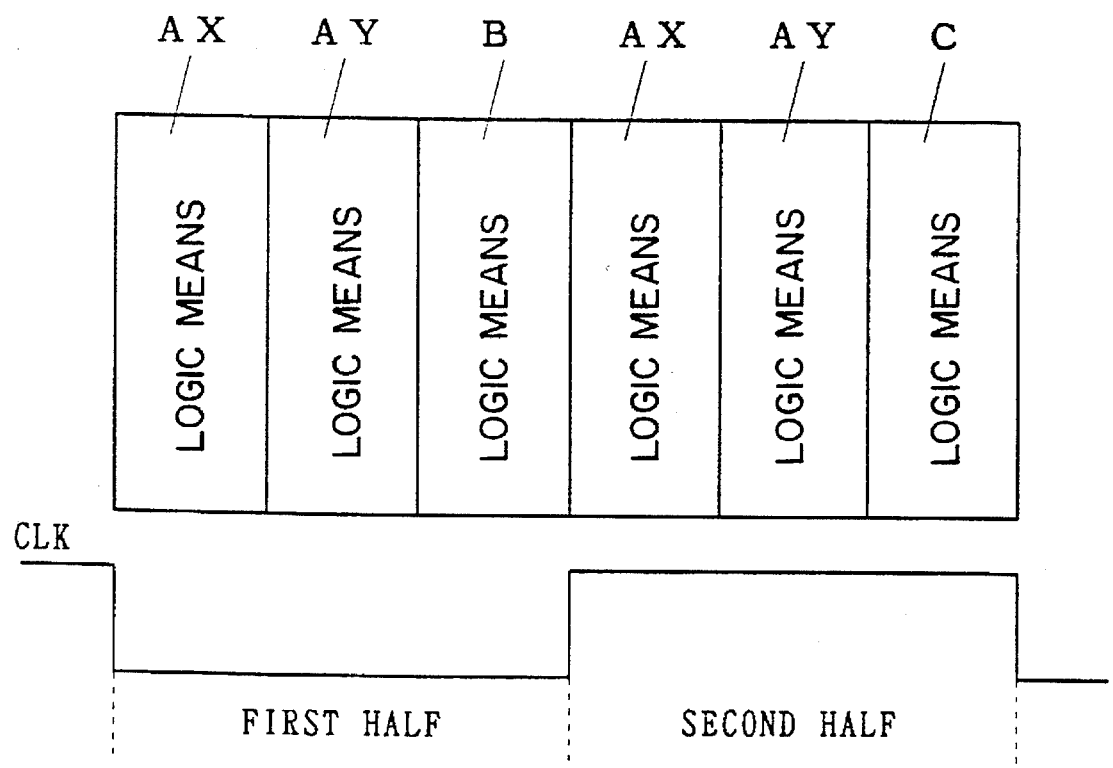
FIG. 13 is a diagram showing the action of the third preferred embodiment of the semiconductor integrated circuit of the invention.

This operation is schematically shown in FIG. 13. In FIG. 13, corresponding to the clock signal CLK, blocks coded with AX, AY, B, AX, AY, and C are arranged sequentially. It means that the logic actions AX, AY, and B are executed in the first half period when the clock signal is low, while the logic actions AX, AY, and C are executed in the second half period when the clock signal is high.

Therefore, according to the semiconductor integrated circuit of the invention, even in the constitution of consecutive logic means AX and AY, by using the logic means AX and AY twice, the logic actions AX+AY+B+AX+AY+C can be executed without installing two sets of consecutive logic means AX and AY in the logic block, so that the hardware of the logic block can be reduced in size.

<Fourth Preferred Embodiment>

<Constitution of Logic Block 400>

Figure 14:
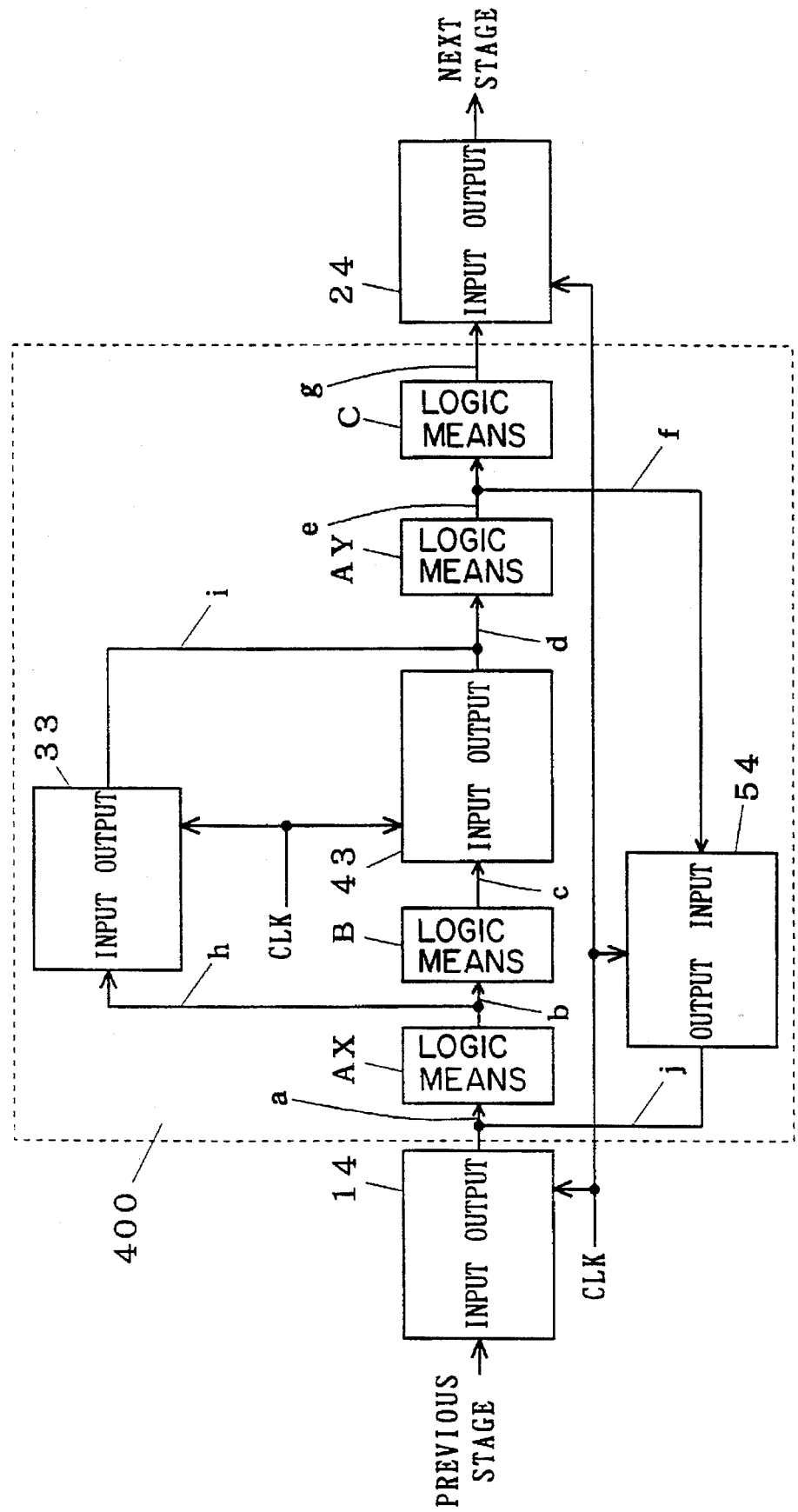
FIG. 14 is a block diagram showing a constitution of a fourth preferred embodiment of a semiconductor integrated circuit of the invention.

FIG. 14 shows the constitution of a logic block 400 as a fourth preferred embodiment of a semiconductor integrated circuit of the invention. In FIG. 14, at the input side and output side of the logic block 400, pipeline registers 14 and 24 are connected. The logic block 400 comprises logic means AX, logic means AY, logic means B, and logic means C, and the output of the pipeline register 14 is connected to the logic means AX through signal line a, and the logic means AX and logic means B are connected through signal line b. The logic means B is connected to the input of an N latch 43 through signal line c, and the output of the N latch 43 is connected to the logic means AY through signal line d. The logic means AY is connected to the input of a register 54 through signal f connected to signal e, and the output of the register 54 is connected to the signal line d through signal line j. The logic means AY is also connected to the logic means C through signal line e, and the logic means C is connected to the pipeline register 24 through signal line g.

The logic means AX is also connected to the input of a P latch 33 through signal line h connected to the signal line b, and the output of the P latch 33 is connected to the signal line d through signal line i.

Herein, a clock signal CLK is given to the pipeline registers 14 and 24, register 54, and P latches 33 and 44. The pipeline registers 14 and 24 are registers of flip-flops of falling edge type, while the register 54 is a register of a flip-flop of rising edge type.

<Operation of Logic Block 400>

The operation of the logic block 400 is described below by reference to FIG. 14. First, when the clock signal CLK changes from high to low, the output of the pipeline register 14, that is, the output of the flip-flop of falling edge type opens, and the input signal IS from the logic block of the previous stage held in the pipeline register 14 is given to the signal line a.

The input signal IS is given to the signal line b as signal S1 by passing through the logic means AX, and further passes through the logic means B to be given to the input of the N latch 43 through signal line c as signal S2. The N latch 43 is a negative latch, and the output is open, and hence the signal S2 is given to the logic means AY through signal line d.

On the other hand, the signal S1 is given to the P latch 33 through signal line h, but since the P latch 33 is a positive latch, its output is closed, and the signal S1 will not be given to the signal line i.

The signal S2 passes through the logic means AY, and is applied to the register 54 from signal line e through signal line f as signal S3. At this time, the input of the register 54, that is, the input of the flip-flop of rising edge type is open, and the signal S3 is held in the register 54. However, since the output of the register 54 is closed, the signal S3 will not be given to the signal line a.

Meanwhile, the signal S3 is given to the logic means C through signal line e, and is further given to the pipeline register 24 as signal S31 by passing through the logic means C. At this time, the input of the pipeline register 24, that is, the input of the flip-flop of falling edge type is closed, and the signal S31 is not held.

Next, when the clock signal CLK changes from low to high, the output of the pipeline register 14 is closed, and the output of the register 54 is opened, and the signal S3 held in the register 54 is given to the logic means AX through signal line a from signal line j.

The signal S3 passes through the logic means AX, and is given to the P latch 33 through signal line h as signal S4. At this time, since the output of the P latch 33 is open, the signal S4 is given to the logic means AY from signal i through signal d.

On the other hand, the signal S4 is also given to the logic means B through signal line b, and passes through the logic means B to be given to the N latch 43 as signal S41, and at this time since the output of the N latch 43 is closed, the signal S41 is not given to the signal line d.

The signal S4 passes through the logic means AY, and is applied to the logic means C through signal line e as signal S5, and also passes through the logic means C to be given to the pipeline register 24 as signal S6. Since the input of the pipeline register 24 is open, the signal 6 is held in the pipeline register 24.

Meanwhile, the signal S5 is also given to the register 54 from signal e through signal f, but since the input of the register 54 is closed at this time, the signal S5 is not held.

Again, when the clock signal CLK changes from high to low, the signal S6 held in the pipeline register 24, that is, the signal undergoing the logic actions AX+B+AY+AX+AY+C is given to the logic block of the next stage, and a new input signal from the logic block of preceding stage is given to the signal line a.

Figure 15:
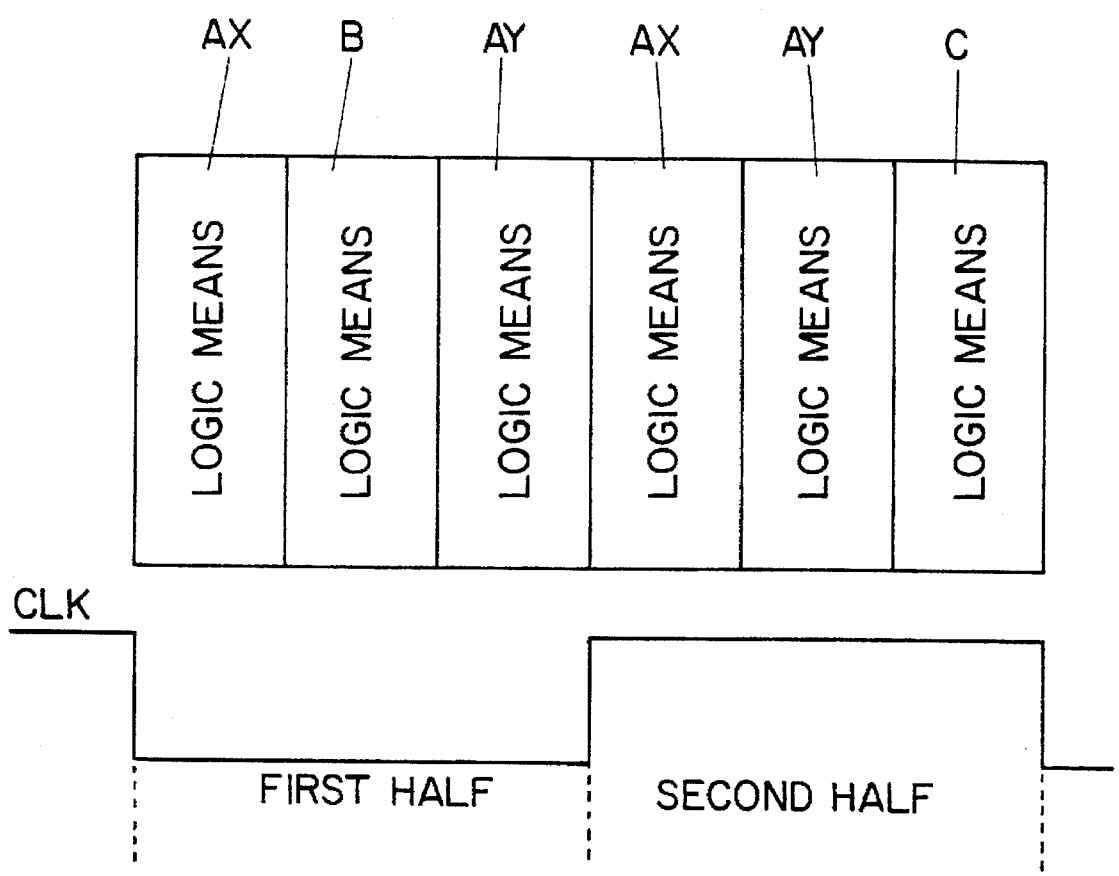
FIG. 15 is a diagram showing the action of the fourth preferred embodiment of the semiconductor integrated circuit of the invention.

This operation is schematically shown in FIG. 15. In FIG. 15, corresponding to the clock signal CLK, blocks coded with AX, B, AY, AX, AY, and C are arranged sequentially. It means that the logic actions AX, B, and AY are executed in the first half period when the clock signal is low, while the logic actions AX, AY, and C are executed in the second half period when the clock signal is high.

Therefore, according to the semiconductor integrated circuit of the invention, even in the constitution of interposing the logic means B between the logic means AX and AY, by using the logic means AX and AY twice, the logic actions AX+B+AY+AX+AY+C can be executed without installing two sets of consecutive logic means AX and AY in the logic block, so that the hardware of the logic block can be reduced in size.

<Fifth Preferred Embodiment>

<Constitution of Logic Block 500>

Figure 16:
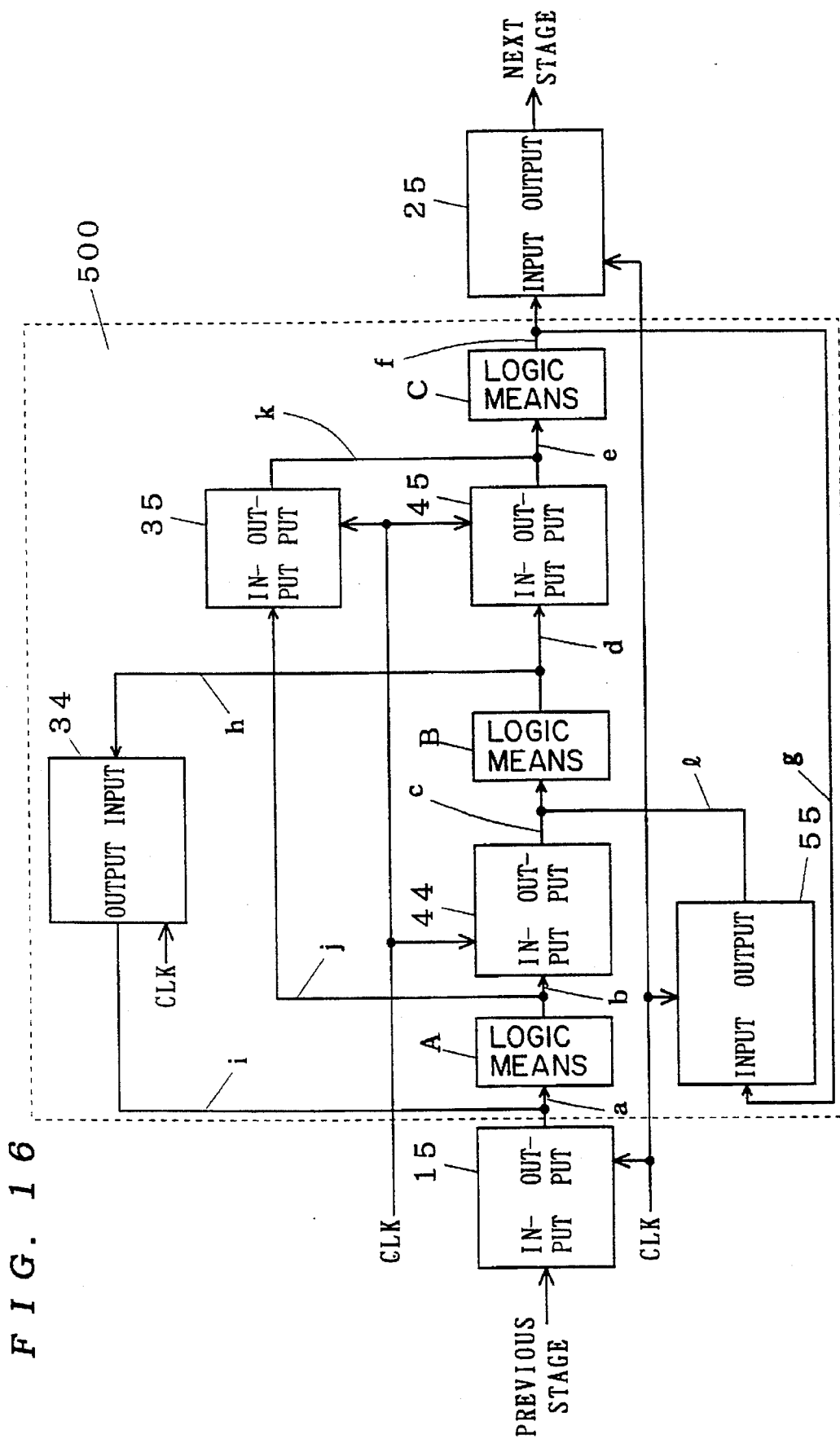
FIG. 16 is a block diagram showing a constitution of a fifth preferred embodiment of a semiconductor integrated circuit of the invention.

FIG. 16 shows the constitution of a logic block 500 as a fifth preferred embodiment of a semiconductor integrated circuit of the invention. In FIG. 16, at the input side and output side of the logic block 500, pipeline registers 15 and 25 are connected. The logic block 500 comprises logic means A, logic means B, and logic means C, and the output of the pipeline register 15 is connected to the logic means A through signal line a, and the logic means A is connected to the input of an N latch 44 through signal line b, and the output of the N latch 44 is connected to the logic means B through signal line d.

The logic means B is connected to the input of an N latch 45, and the output of the N latch 45 is connected to the logic means C through signal line e, and the logic means C is connected to the pipeline register 25 through signal line f. On the other hand, the logic means C is also connected to the input of a register 55 through signal line g connected to the signal line f, and the output of the register 55 is connected to the signal line c through signal line 1.

The logic means B is also connected to the input of a P latch 34 through signal line h connected to the signal line d, and the output of the P latch 34 is connected to the signal line a through signal line i. The logic means A is also connected to the input of a P latch 35 through signal line j connected to the signal line b, and the output of the P latch 35 is connected to signal line e through signal line k.

Herein, a clock signal CLK is given to the pipeline registers 15 and 25, register 55, and P latches 34, 35, and N latches 44, 45. The pipeline registers 15 and 25 are registers of flip-flops of falling edge type, while the register 55 is a register of a flip-flop of rising edge type.

<Operation of Logic Block 500>

The operation of the logic block 500 is described below by reference to FIG. 16. First, when the clock signal CLK changes from high to low, the output of the pipeline register 15, that is, the output of the flip-flop of falling edge type opens, and the input signal IS from the logic block of the previous stage held in the pipeline register 15 is given to the signal line a.

The input signal IS is given to the signal line b as signal S1 by passing through the logic means A, and is given to the input of the N latch 44 through signal line b as signal S2. The output of the N latch 44 is open, and hence the signal S1 is given to the logic means B through signal line c.

On the other hand, the signal S1 is given also to the output of the P latch 35 through signal line j, but since the output of the P latch 35 is closed, and thereby the signal S1 will not be given to the signal line k.

The signal S1 passes through the logic means B, and is given to the input of the N latch 45 through signal line d as signal S2. The output of the N latch 45 is open, and the signal S2 is given to the logic means C through signal line e.

Although the signal S2 is applied also to the input of the P latch 34 through signal line h, the output of the P latch 34 is closed, and hence the signal S2 is not given to signal line i.

The signal S2 passes through the logic means B, and is applied to the register 55 from signal line f through signal line g as signal S3. At this time, the input of the register 55, that is, the input of the flip-flop of rising edge type is open, and the signal S3 is held in the register 55. However, since the output of the register 55 is closed, the signal S3 will not be given to the signal line c.

Meanwhile, the signal S3 is also given to the pipeline register 25 through signal line f. At this time, the input of the pipeline register 25, that is, the input of the flip-flop of falling edge type is closed, and the signal S31 is not held.

Next, when the clock signal CLK changes from low to high, the output of the pipeline register 15 is closed, and the output of the register 55 is opened, and the signal S3 held in the register 55 is given to the logic means B through signal line c from signal line 1.

The signal S3 passes through the logic means B, and is given to the P latch 34 through signal line h as signal S4. At this time, since the output of the P latch 34 is open, the signal S4 is given to the logic means A from signal 1 through signal a.

On the other hand, the signal S4 is also given to the N latch 45 through signal line d, and at this time since the output of the N latch 45 is closed, the signal S41 is not given to the signal line e.

The signal S4 passes through the logic means A, and is given to the P latch 35 through signal line j as signal S5. At this time, since the output of the P latch 35 is open, the signal S5 is given to the logic means C from signal line k through signal line e.

Meanwhile, the signal S5 is also given to the N latch 44 through signal b, but since the output of the N latch 44 is closed, the signal S5 is not given to the signal line c.

The signal S5 passes through the logic means C, and is given to the pipeline register 25 through signal line f as signal S6. At this time, the input of the pipeline register 25 is open, and the signal S6 is held in the pipeline register 25.

The signal S6 is also given to the register 55 from signal line f to signal line g, but since the input of the register 55 is closed at this time, the signal S6 is not held.

Again, when the clock signal CLK changes from high to low, the signal S6 held in the pipeline register 25, that is, the signal undergoing the logic actions A+B+C+B+A+C is given to the logic block of next stage, and a new input signal from the logic block of the preceding stage is given to the signal line a.

Figure 17:
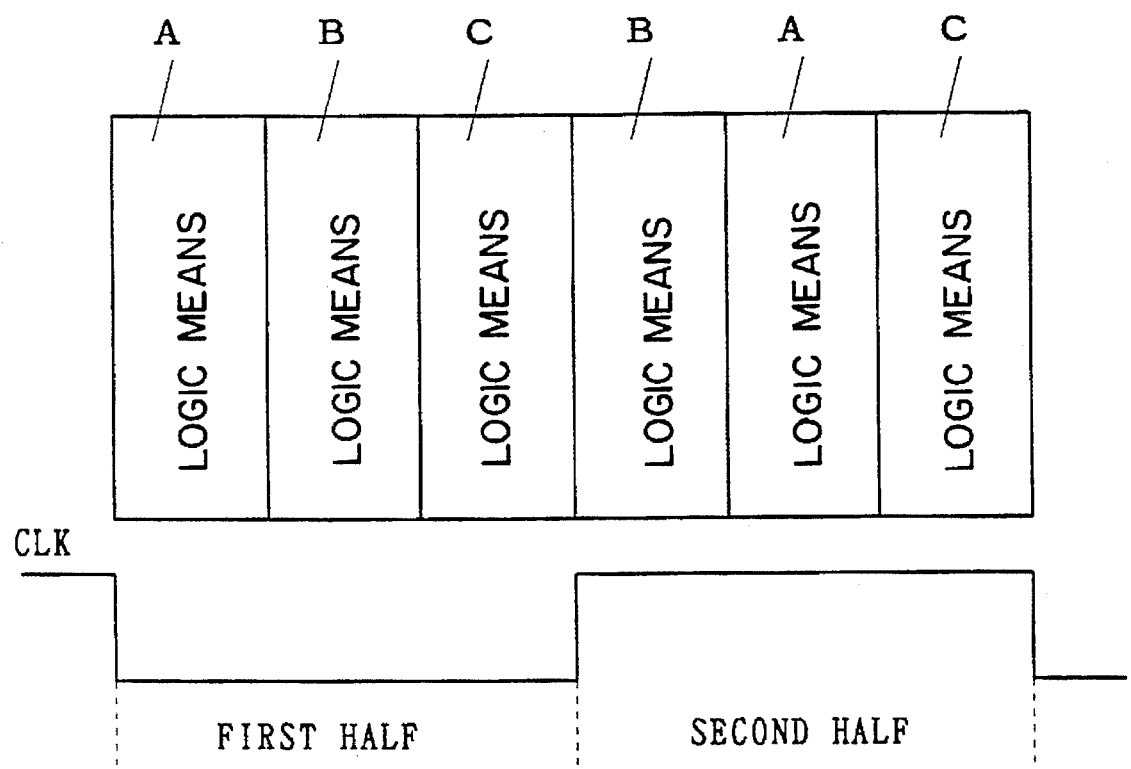
FIG. 17 is a diagram showing the action of the fifth preferred embodiment of the semiconductor integrated circuit of the invention.

This operation is schematically shown in FIG. 17. In FIG. 17, corresponding to the clock signal CLK, blocks coded with A, B, C, B, A, and C are arranged sequentially. It means that the logic actions A, B, and C are executed in the first half period when the clock signal is low, while the logic actions B, A, and C are executed in the second half period when the clock signal is high.

Therefore, according to the semiconductor integrated circuit of the invention, even in the constitution of sequential arrangement of the logic means A, B, and C, by using them by changing the order in the second half period of clock signal, the logic actions A+B+C+B+A+C can be executed without installing two sets of logic means A, B, and C in the logic block, so that the hardware of the logic block can be reduced in size.

<Sixth Preferred Embodiment><

Constitution of Logic Block 600>

Figure 18:
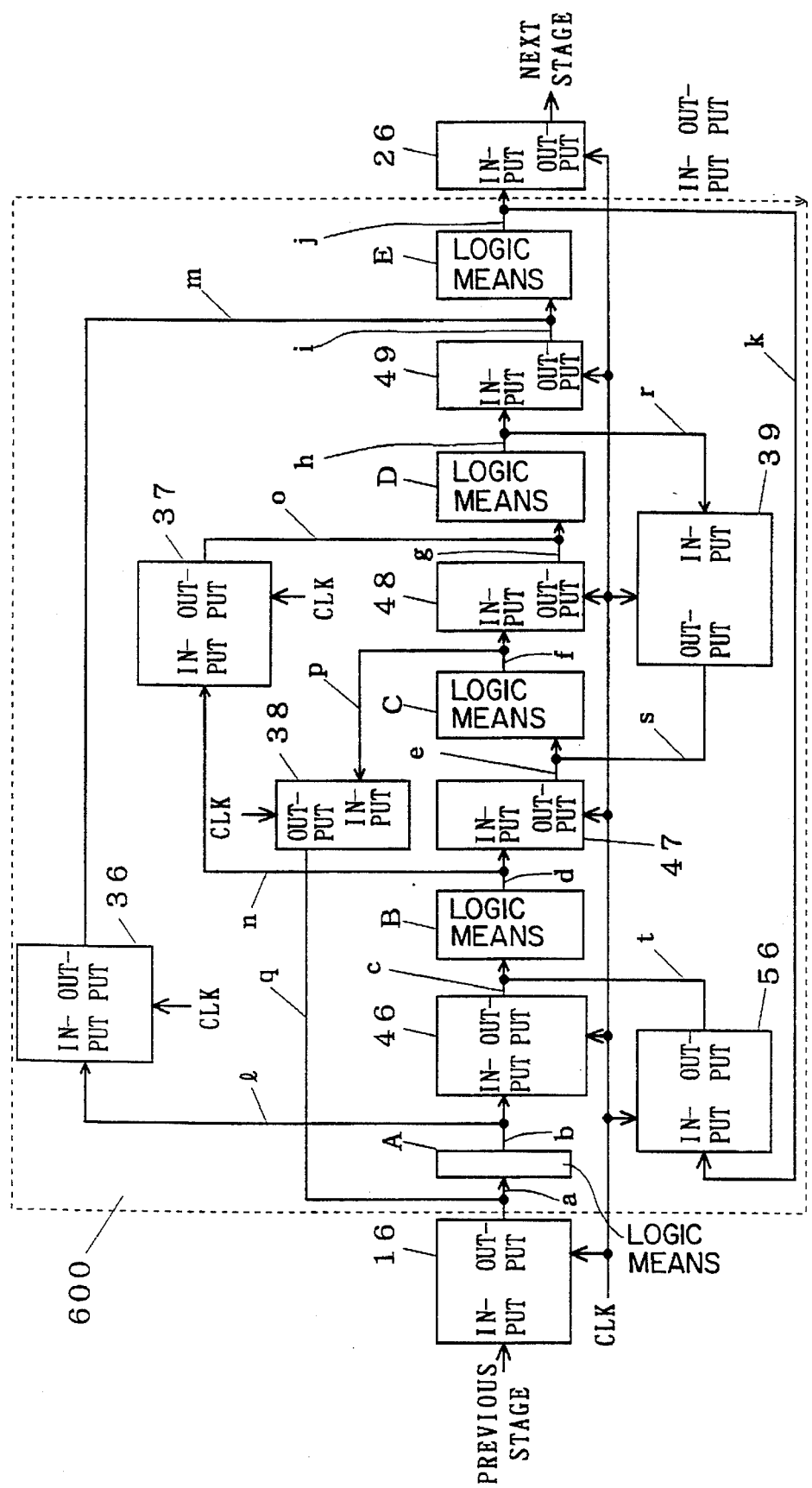
FIG. 18 is a block diagram showing a constitution of a sixth preferred embodiment of a semiconductor integrated circuit of the invention.

FIG. 18 shows the constitution of a logic block 600 as a sixth preferred embodiment of a semiconductor integrated circuit of the invention. In FIG. 18, at the input side and output side of the logic block 600, pipeline registers 16 and 26 are connected. The logic block 600 comprises logic means A, logic means B, logic means C, logic means D, and logic means E, and the output of the pipeline register 16 is connected to the logic means A through signal line a, the logic means A is connected to the input of an N latch 46 through signal line b, and the output of the N latch 46 is connected to the logic means B through signal line c.

The logic means B is connected to the input of an N latch 47 through signal line d, and the output of the N latch 47 is connected to the logic means C through signal line e, the logic means C is connected to the input of an N latch 48 through signal line f, and the output of the N latch 48 is connected to the logic means D through signal line g.

The logic means D is connected to the input of an N latch 49 through signal line h, and the output of the N latch 49 is connected to the logic means E through signal line i, and the logic means E is connected to the pipeline register 26.

On the other hand, the logic means E is also connected to the input of a register 56 through signal line k connected to the signal line j, and the output of the register 56 is connected to the signal line c through signal line t.

Moreover, the logic means A is also connected to the input of a P latch 36 through signal line l connected to the signal line b, the output of the P latch 37 is connected to the signal line i through signal line m, the logic means B is also connected to the input of a P latch 37 through signal line n connected to the signal line d, the output of the P latch 37 is connected to the signal line g through signal line o, the logic means C is also connected to the input of a p latch 38 through signal line p connected to the signal line f, the output of the P latch 38 is connected to the signal line a through signal line q, the logic means D is also connected to the input of a P latch 39 through signal line connected to the signal line h, and the output of the P latch 39 is connected to the signal line r through signal line s.

Herein, a clock signal CLK is given to the pipeline registers 16 and 26, register 56, and P latches 36, 37, 38, 39, and N latches 46, 47, 48, 49. The pipeline registers 16 and 26 are registers of flip-flops of falling edge type, while the register 56 is a register of a flip-flop of rising edge type.

<Operation of Logic Block 600>

The operation of the logic block 600 is described below by reference to FIG. 18. First, when the clock signal CLK changes from high to low, the output of the pipeline register 16, that is, the output of the flip-flop of falling edge type opens, and the input signal IS from the logic block of he previous stage held in the pipeline register 16 is given to the signal line a.

The input signal IS passes through the logic means A, and is given to the signal line b as signal S1, and is further applied to the input of the N latch 46 through the signal line b. Since the N latch 46 is a negative latch, its output is open, and the signal S1 is given to the logic means B through the signal line c.

On the other hand, the signal S1 is also given to the output of the P latch 36 through signal line l, but the output of the P latch 36 is closed, and the signal S1 is not given to the signal line m.

The signal S1 passes through the logic means B and is given to the input of the N latch 47 through signal line d as signal S2. The output of the N latch 47 is open, and the signal S2 is given to the logic means C through signal line e.

On the other hand, the signal S2 is also given to the input of the P latch 37 through signal line 1, but the output of the P latch 37 is closed, and the signal S2 is not given to the signal line o.

The signal S2 passes through the logic means C, and is given to the input of the N latch 48 through signal line f as signal S3. The output of the N latch 48 is open, and the signal S3 is given to the logic means D through signal line g, and passes through the logic means D, and is applied to the input of the N latch 49 through signal line h as signal S4. The output of the N latch 49 is open, and the signal S4 is given to the logic means E through signal line i.

On the other hand, the signal S4 is also given to the input of the P latch 39 through signal line r, but the output of the P latch 39 is closed, and the signal S4 is not given to the signal line s.

The signal S4 passes through the logic means E, and is given to the register 56 from signal line j through signal line k as signal S5. At this time, the input of the register, that is, the input of the flip-flop of rising edge type is open, and the signal S5 is held in the register 56. However, since the output of the register 56 is closed, the signal S5 is not given to the signal line c.

On the other hand, the signal S5 is also given to the pipeline register 26 through signal line j. At this time, the input of the pipeline register 26, that is, the input of the flip-flop of falling edge type is closed, and the signal S5 is not held.

Consequently, when the clock signal CLK changes from low to high, the output of the pipeline register 16 is closed, and the output of the register 56 is opened, and the signal S6 held in the register 56 is given to the logic means B from signal line t through signal line c.

The signal S6 passes through the logic means B, and is given to the P latch 37 through signal line n as signal S7. At this time, since the output of the P latch 37 is open, the signal S7 is given to the logic means D from signal line o through signal line g.

On the other hand, the signal S7 is also given to the N latch 47 through signal line d, but since the output of the N latch 47 is closed at this time, signal S7 is not given to the signal line e.

The signal S7 passes through the logic means D, and is given to the P latch 39 from signal line h through signal line r as signal S8. At this time, since the output of the P latch 39 is open, the signal S8 is given to the logic means C from signal line s through signal line e.

On the other hand, the signal S8 is also given to the N latch 49 through signal line h, but since the output of the N latch 49 is closed at this time, signal S8 is not given to the signal line i.

The signal S8 passes through the logic means C, and is given to the P latch 38 from signal line f through signal line p as signal S9. At this time, since the output of the P latch 38 is open, the signal S9 is given to the logic means A from signal line q through signal line a.

On the other hand, the signal S9 is also given to the N latch 48 through signal line f, but since the output of the N latch 48 is closed at this time, signal S9 is not given to the signal line g.

The signal S9 passes through the logic means A, and is given to the P latch 36 from signal line b through signal line l as signal S10. At this time, since the output of the P latch 36 is open, the signal S10 is given to the logic means E from signal line m through signal line i.

On the other hand, the signal S10 is also given to the N latch 46 through signal line b, but since the output of the N latch 46 is closed at this time, signal S10 is not given to the signal line c.

The signal S10 passes through the logic means A, and is given to the pipeline register 26 through signal line j as signal S11. At this time, since the input of the pipeline register 26 is open, the signal S11 is held in the pipeline register 26.

On the other hand, the signal S11 is also given to the register 56 from signal line j through signal line k, but since the input of the register 56 is closed at this time, the signal S6 is not held.

Again, when the clock signal CLK changes from high to low, the signal S11 held in the pipeline register 26, that is, the signal undergoing the logic actions A+B+C+D+E+B+D+C+A+E is given to the logic block of the next stage, and a new input signal from the logic block of preceding stage is given to the signal line a.

Figure 19:
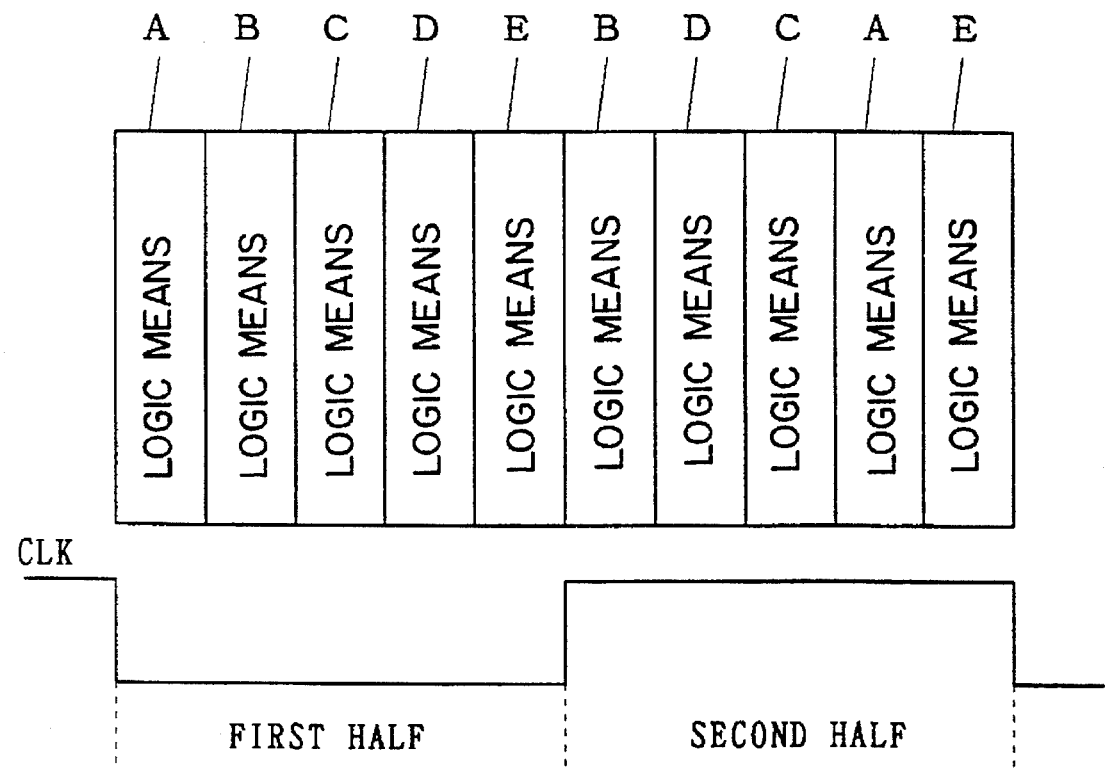
FIG. 19 is a diagram showing the action of the sixth preferred embodiment of the semiconductor integrated circuit of the invention.
Figure 20:
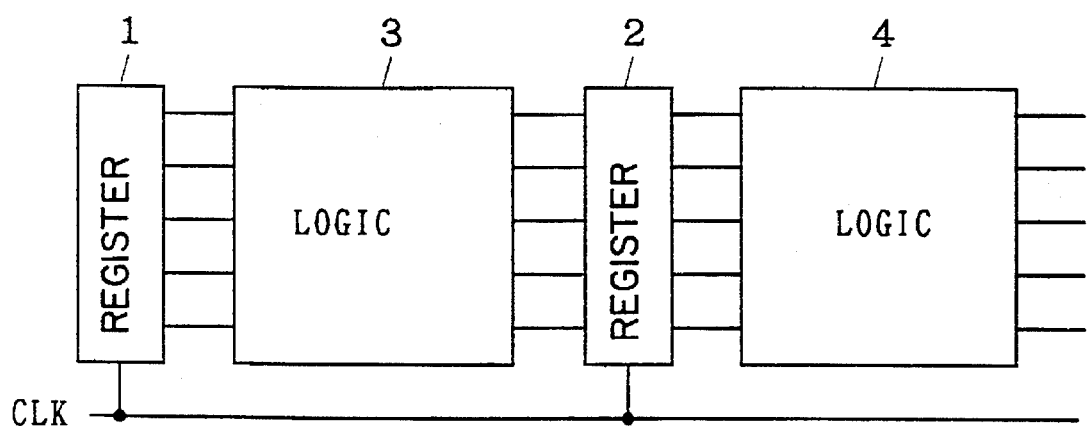
FIG. 20 is a block diagram showing a semiconductor integrated circuit in a pipeline structure of an edge trigger clock system.
Figure 21:
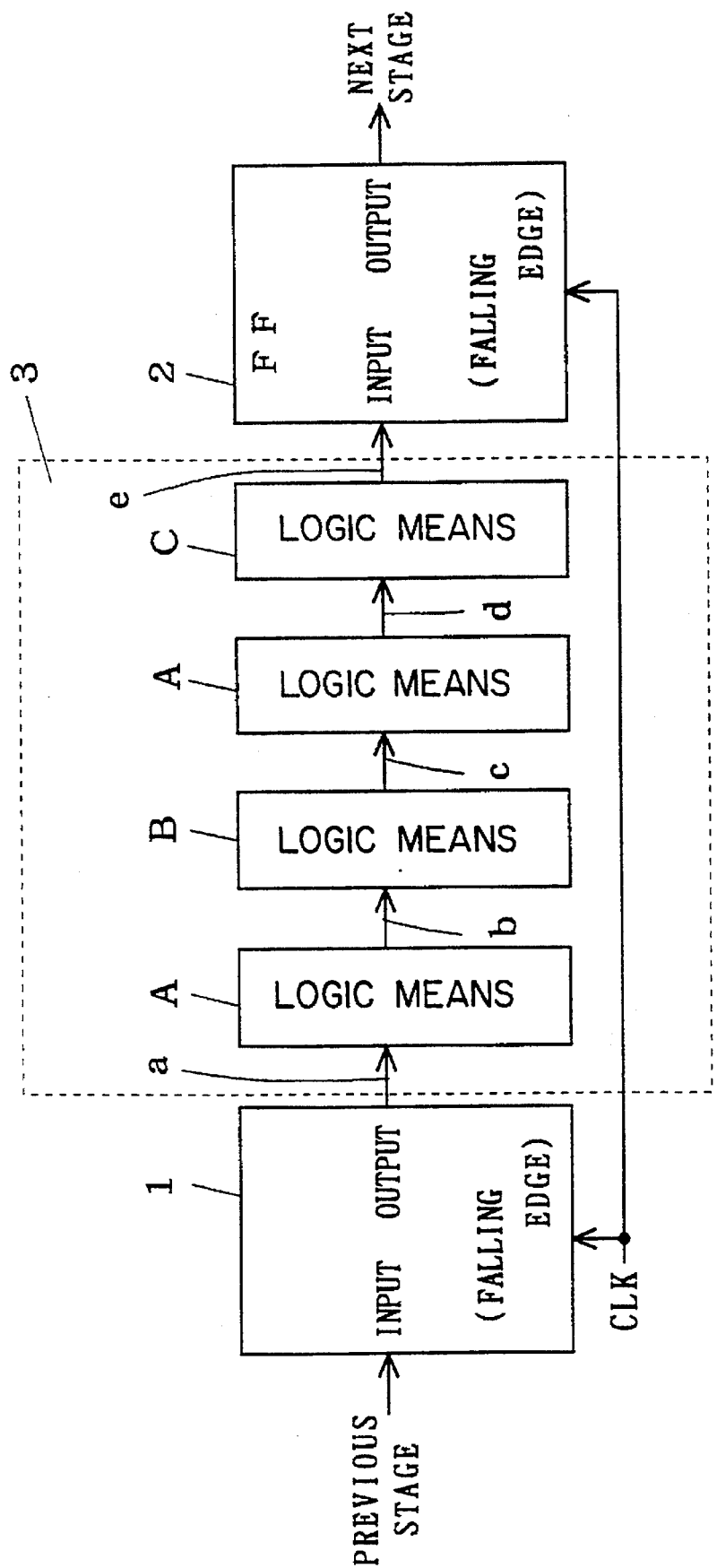
FIG. 21 is a block diagram showing a constitution of the logic block of a pipeline structure of an edge trigger clock system.

This operation is schematically shown in FIG. 19. In FIG. 19, corresponding to the clock signal CLK, blocks coded with A, B, C, D, E, B, D, C, A, and E are arranged sequentially. It means that the logic actions A, B, C, D, and E are executed in the first half period when the clock signal is low, while the logic actions B, D, C, A, and E are executed in the second half period when the clock signal is high.

Therefore, according to the semiconductor integrated circuit of the invention, even in the constitution of sequential arrangement of the logic means A, B, C, D, and E, by using them by changing the order in the second half period of clock signal, the logic actions A+B+C+D+E can be executed without installing two sets of logic means A, B, C, D, and E in the logic block.

It means, however the number of constitutions may be, that it is not necessary to duplicate the constitution as for the repeated logic action, as far as used separately in the first half and second half of the clock signal, and if the sequence of logic actions differs between the first half and second half, it can be solved by disposing a bypass route and combining a P latch and N latch so that the route of the signal may differ in the first half and second half of clock signal.

Incidentally, in the first, second, fifth, and sixth preferred embodiments described above, P latches and N latches are used to vary the signal route in the first half and second half of the clock signal, but the latch function may be omitted if there is any function as a gate depending on the clock signal.

While the invention has been shown and described in detail, the foregoing description is in all aspects illustrative and not restrictive. It is therefore understood that numerous modifications and variations can be devised without departing from the scope of the invention.

I claim:

1. A semiconductor integrated circuit in a pipeline structure comprising:

a logic block for performing logic action in one period of a clock signal, an input register for temporarily storing an input signal to said logic block, by operating in response to said clock signal, and an output register for temporarily storing an output signal from said logic block, by operating in response to said clock signal, wherein said logic block is divided into a first half operating section, with its input side connected to said input register, for performing logic action in a first half period of one period of said clock signal by at least one logic means, and a second half operating section, with its output side connected to said output register, for performing logic action in a second half period of one period of said clock signal by at least one logic means, the logic means of said first half operating section and the logic means of said second half operating section include at least one common logic means to be shared between said first half operating section and said second half operating section, and said logic block comprises memory means for temporarily storing the output of said first half operating section by operating complementarily to said input and output registers, with its input side connected to the output side of said first half operating section, and output side connected to the input side of said second half operating section.

2. A semiconductor integrated circuit of claim 1, wherein the logic means of said first half operating section further includes at least one first half logic means not shared with the logic means of said second half operating section.

3. A semiconductor integrated circuit of claim 1, wherein the logic means of said second half operating section further includes at least one second half logic means not shared with the logic means of said first half operating section.

4. A semiconductor integrated circuit of claim 1, wherein the logic means of said first half operating section further includes at least one first half logic means not shared with the logic means of said second half operating section, and the logic means of said second half operating section further includes at least one second half logic means not shared with the logic means of said first half operating section.

5. A semiconductor integrated circuit of claim 1, wherein said logic means for the first half operating section, said logic means for the second half operating section, and said common logic means in said logic block are connected by at least one signal route in the sequence of signal transmission, and said logic block further comprises route selecting means for selecting only one signal route in response to said clock signal, if two or more of said at least one signal routes are connected in the input or output of one logic means of said logic means for the first half operating section, said logic means for the second half operating section, and said common logic means.

6. A semiconductor integrated circuit of claim 5, wherein said input and output registers include a register of a first switching type of which output is open and input is closed in the first half period of said clock signal, and reversely open/closed in the second half period, said memory means includes a register of a second switching type of which output is closed and input is open in the first half period of said clock signal, and reversely open/closed in the second half period, and said route selecting means includes gate means of the first switching type to open and close synchronously with said input and output register, and gate means of the second switching type to open and close complementarily to said gate means of the first switching type.

7. A semiconductor integrated circuit of claim 6, wherein said register of said first switching type is composed of a flip-flop of falling edge type, opened in the output and closed in the input when said clock signal is at low level, said register of said second switching type is composed of a flip-flop of rising edge type, closed in the output and opened in the input when said clock signal is at high level, said gate means of said first switching type is composed of a negative latch, opened in the output when said clock signal is at low level, and said gate means of said switching type is composed of a positive latch, opened in the output when said clock signal is at high level.

* * * * *